US009865731B2

(12) United States Patent
Chen et al.

(10) Patent No.: US 9,865,731 B2
(45) Date of Patent: Jan. 9, 2018

(54) SEMICONDUCTOR DEVICE AND MANUFACTURING METHOD THEREOF

(71) Applicant: TAIWAN SEMICONDUCTOR MANUFACTURING COMPANY LTD., Hsinchu (TW)

(72) Inventors: I-Chih Chen, Tainan (TW); Ying-Lang Wang, Tai-Chung County (TW); Chih-Mu Huang, Tainan (TW); Ying-Hao Chen, Tainan (TW); Wen-Chang Kuo, Tainan (TW); Jung-Chi Jeng, Tainan (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 22 days.

(21) Appl. No.: 14/081,517

(22) Filed: Nov. 15, 2013

(65) Prior Publication Data
US 2015/0137247 A1    May 21, 2015

(51) Int. Cl.
*H01L 27/12*    (2006.01)
*H01L 29/78*    (2006.01)
(Continued)

(52) U.S. Cl.
CPC .... *H01L 29/7833* (2013.01); *H01L 21/26506* (2013.01); *H01L 21/823807* (2013.01);
(Continued)

(58) Field of Classification Search
CPC ............... H01L 29/78; H01L 29/66477; H01L 29/66484; H01L 29/6659; H01L 29/105;
(Continued)

(56) References Cited

U.S. PATENT DOCUMENTS 6,818,938 B1 * 11/2004 Naem ................. H01L 29/1054
257/192
7,169,675 B2 * 1/2007 Tan ................... H01L 21/26506
257/E21.335
(Continued)

OTHER PUBLICATIONS

R. D. Rung, H. Momose, and Y. Nagakubo, "Deep Trench Isolated CMOS Devices", International Electron Devices Meeting 1982, pp. 237-243. Published by IEEE in 1982.*
(Continued)

*Primary Examiner* — Jesse Y Miyoshi
*Assistant Examiner* — Tuan A Hoang
(74) *Attorney, Agent, or Firm* — WPAT, P.C., Intellectual Property Attorneys; Anthony King

(57) ABSTRACT

A semiconductor device includes a p-type metal oxide semiconductor device (PMOS) and an n-type metal oxide semiconductor device (NMOS) disposed over a substrate. The PMOS has a first gate structure located on the substrate, a carbon doped n-type well disposed under the first gate structure, a first channel region disposed in the carbon doped n-type well, and activated first source/drain regions disposed on opposite sides of the first channel region. The NMOS has a second gate structure located on the substrate, a carbon doped p-type well disposed under the second gate structure, a second channel region disposed in the carbon doped p-type well, and activated second source/drain regions disposed on opposite sides of the second channel region.

20 Claims, 19 Drawing Sheets

(51) Int. Cl.
*H01L 27/092* (2006.01)
*H01L 21/8238* (2006.01)
*H01L 21/265* (2006.01)
*H01L 21/84* (2006.01)
*H01L 29/161* (2006.01)
*H01L 29/66* (2006.01)

(52) U.S. Cl.
CPC ...... *H01L 21/823892* (2013.01); *H01L 21/84* (2013.01); *H01L 27/0928* (2013.01); *H01L 29/161* (2013.01); *H01L 29/6659* (2013.01)

(58) Field of Classification Search
CPC .. H01L 29/7833; H01L 21/84; H01L 27/0928
See application file for complete search history.

(56) References Cited

U.S. PATENT DOCUMENTS

| | | | | |
|---|---|---|---|---|
| 7,560,780 | B2* | 7/2009 | Curello | H01L 21/26506 257/369 |
| 7,696,000 | B2* | 4/2010 | Liu | H01L 21/26506 257/E21.085 |
| 7,838,401 | B2* | 11/2010 | Ohta | H01L 21/26506 257/E29.13 |
| 7,906,381 | B2* | 3/2011 | Loubet | H01L 21/823412 257/350 |
| 8,389,350 | B2* | 3/2013 | Sakakidani | H01L 21/26506 257/402 |
| 8,569,156 | B1* | 10/2013 | Scudder et al. | 438/527 |
| 9,112,057 | B1* | 8/2015 | Pradhan | H01L 29/1079 |
| 2010/0164017 | A1* | 7/2010 | Noda | H01L 21/2253 257/402 |
| 2012/0146113 | A1* | 6/2012 | Suzuki | C23C 16/0236 257/288 |
| 2012/0187524 | A1* | 7/2012 | Huang | H01L 21/02321 257/506 |
| 2013/0264653 | A1* | 10/2013 | Cai | H01L 29/16 257/369 |
| 2014/0038386 | A1* | 2/2014 | Scudder | H01L 29/105 438/433 |
| 2014/0054649 | A1* | 2/2014 | Bazizi | H01L 29/6659 257/192 |
| 2014/0057421 | A1* | 2/2014 | Oh | H01L 21/02658 438/499 |

OTHER PUBLICATIONS

K. Cheng et al. "Extremely thin SOI (ETSOI) CMOS with Record Low Variability for Low Power System-on-Chip Applications", International Electron Devices Meeting 2009, pp. 49-52. Published by IEEE in 2009.*

Cheng et al. "Extremely thin SOI (ETSOI) CMOS with record low variability for low power system-on-chip applications", International Electron Devices Meeting 1982, pp. 237. Published by IEEE in 2009.*

Cheng et al. "Extremely thin SOI (ETSOI) CMOS with record low variability for low power system-on-chip applications" in International Electron Devices Meeting 1982, pp. 237. Published by IEEE in 2009.*

Cheng et al. "Extremely thin SOI (ETSOI) CMOS with record low variability for low power system-on-chip applications", in International Electron Devices Meeting in 1982, p. 237. Published by IEEE in 2009.*

Cheng et al. ("Extremely thin SOI (ETSOI) CMOS with record low variability for low power system-on-chip applications", International Electron Devices Meeting 1982, pp. 237. Published by IEEE in 2009).*

* cited by examiner

SEMICONDUCTOR DEVICE AND MANUFACTURING METHOD THEREOF

FIELD

The present disclosure relates to a semiconductor device and in particular, to a semiconductor device with a controlled doped profile and a method of manufacturing a semiconductor device.

BACKGROUND

A significant trend throughout integrated circuit (IC) development is the downsizing of IC components. As the size reduces, the performance requirements become more stringent. As devices continue to shrink in size, the channel region also continues to shrink as well. For metal-oxide-semiconductor field effect transistors (MOSFETs), increased performance requirements have generally been met by aggressively scaling the length of the channel region. However, such a short channel length faces high electric field and manufacturing limits.

Generally, threshold voltage is directly related to the doping concentration in a channel. As the length of a channel continues to shrink, diffusion of dopants becomes much harder to control. There are various thermal processes throughout a semiconductor manufacturing. For example, after dopants are implanted into a substrate, a thermal process is used to activate the dopants. In addition, after a deposition, a thermal process is required to repair broken bonding at an interface. However, these thermal processes cause dopant diffusion in an unintentional way. Diffused dopants may penetrate into a channel region. The electrical properties, such as threshold voltage, are altered and deviated from a predetermined value. This causes uniformity between each device and is a severe problem in circuit design.

In addition, shorter channel lengths suffer from fluctuation of higher implantation concentration and depth. This situation is significant for boron, which has a relatively lower atomic weight and a longer diffused length. As a result, it is difficult for IC designers to control the doped profile. The unintentional dopant diffusion induces a poor threshold voltage and saturation current uniformity.

BRIEF DESCRIPTION OF THE DRAWINGS

Aspects of the present disclosure are described with reference to the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION OF THE INVENTION

The making and using of various embodiments of the disclosure are discussed in detail below. It should be appreciated, however, that the embodiments provide many applicable inventive concepts that can be embodied in a wide variety of specific contexts. The specific embodiments discussed are merely illustrative, and do not limit the scope of the disclosure.

The terms "wafer" and "substrate," as used herein, are to be understood as including silicon, silicon-on-insulator (SOI) technology, silicon-on-sapphire (SOS) technology, doped and undoped semiconductors, epitaxial layers of silicon supported by a base semiconductor foundation, and other semiconductor structures. Furthermore, when reference is made to a "wafer" or "substrate" in the following description, previous processing steps may have been utilized to form regions, junctions, or material layers in or over the base semiconductor structure or foundation. In addition, the semiconductor need not be silicon-based, but could be based on silicon-germanium, germanium, gallium arsenide or other semiconductor structures.

The term "isolation," as used herein, refers to an oxide structure or a dielectric structure for isolating devices. There are two typical formation processes, one is Local Oxidation of Silicon (LOCOS) and the other is Shallow Trench Isolation (STI). In an image sensor, the isolation is disposed between imaging pixels and adjacent imaging pixels so as to isolate the adjacent imaging pixels. In addition, the isolation is configured to act as a barrier to keep charge carriers (holes or electrons) from penetrating into an adjacent imaging pixel.

The terms "deposition" and "deposit," as used herein, refer to operations of depositing materials on a substrate using a vapor phase of a material to be deposited, a precursor of the material, and an electrochemical reaction or sputtering/reactive sputtering. Depositions using a vapor phase of a material include any operations such as, but not limited to, chemical vapor deposition (CVD) and physical vapor deposition (PVD). Examples of vapor deposition methods include hot filament CVD, rf-CVD, laser CVD (LCVD), conformal diamond coating operations, metal-organic CVD (MOCVD), thermal evaporation PVD, ionized metal PVD (IMPVD), electron beam PVD (EBPVD), reactive PVD, atomic layer deposition (ALD), plasma enhanced CVD (PECVD), high density plasma CVD (HDPCVD), low pressure CVD (LPCVD), and the like. Examples of deposition using an electrochemical reaction include electroplating, electro-less plating, and the like. Other examples of deposition include pulse laser deposition (PLD) and atomic layer deposition (ALD).

Figure 1:
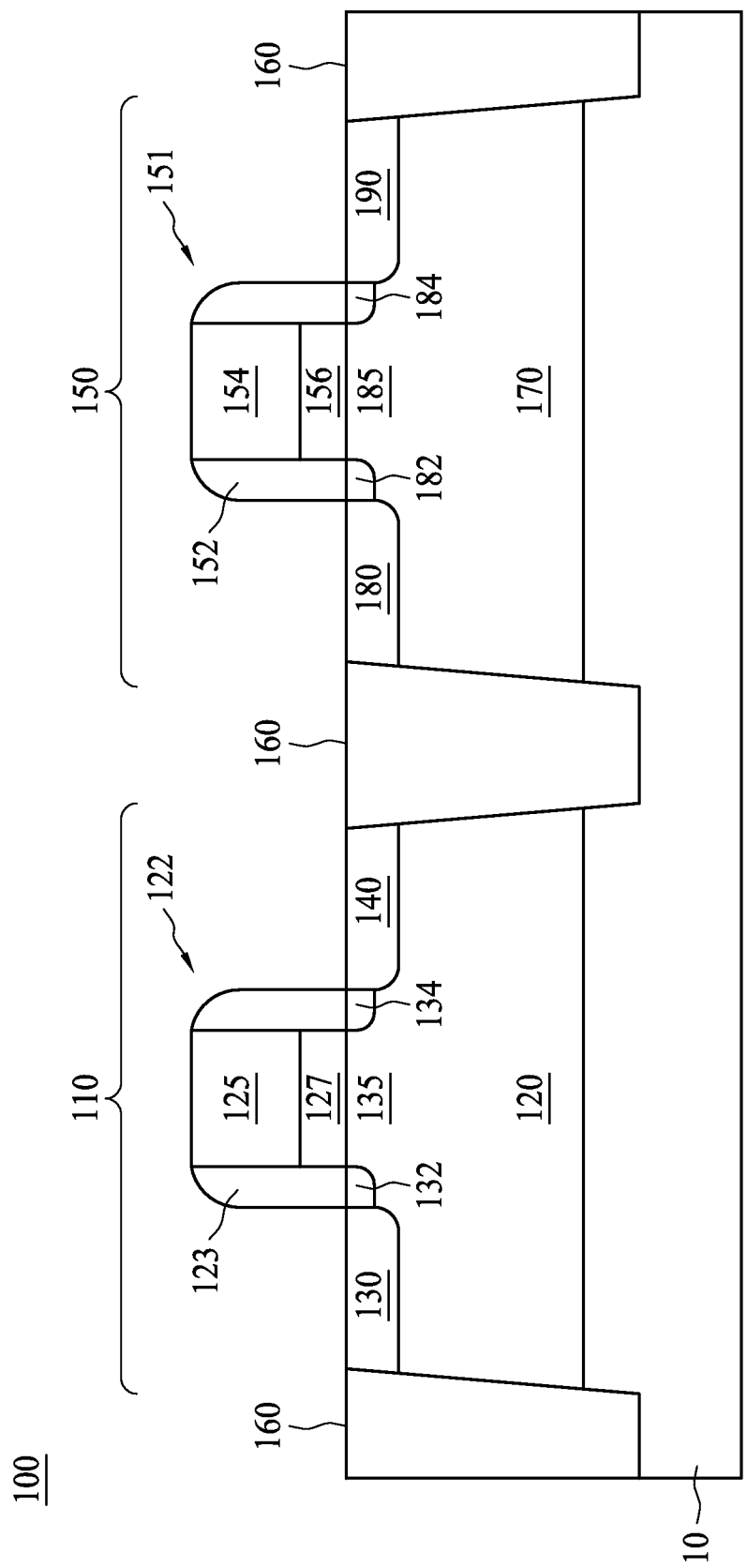
FIG. 1 is a semiconductor device in accordance with some embodiments of the present disclosure.

In reference to the Figures, FIG. 1 is a semiconductor device 100 in accordance with some embodiments of the present disclosure. The semiconductor device 100 is formed on a substrate 10. In an embodiment, the substrate 10 is a silicon substrate or an SOI substrate. The semiconductor device 100 includes a p-type metal oxide semiconductor (PMOS) region 110 and an n-type metal oxide semiconductor (NMOS) region 150. Dielectric isolations 160 are located between the PMOS region 110 and the NMOS region 150.

The PMOS region 110 includes a first gate structure 122, a carbon doped n-type well 120, a first channel region 135, an activated first source region 130, an activated first drain region 140, an activated first source extension region 132, and an activated first drain extension region 134. The first gate structure 122 further includes a first gate electrode 125, a first gate dielectric 127, and a first sidewall spacer 123.

Similarly, the NMOS region 150 includes a second gate structure 151, a carbon doped p-type well 170, a second channel region 185, an activated second source region 180, an activated second drain region 190, an activated second source extension region 182, and an activated second drain extension region 184. The second gate structure 151 further includes a second gate electrode 154, a second gate dielectric 156, and a second sidewall spacer 152.

With regard to the PMOS region 110, the first gate structure 122 is located on the substrate 10. The carbon doped n-type well 120 is formed in the substrate 10 under the first gate structure 122. The first channel region 135, the activated first source region 130, the activated first drain region 140, the activated first source extension region 132, and the activated first drain extension region 134 are formed within the carbon doped n-type well 120. Further, the first channel region 135 is disposed below the first gate dielectric 127. The activated first source region 130 and the activated first drain region 140 are disposed on opposite sides of the first channel region 135. The activated first source extension region 132 and the activated first drain extension region 134 are also disposed on opposite sides of the first channel region 135. Moreover, the activated first source region 130 is disposed adjacent to the activated first source extension region 132, and the activated first drain region 140 is disposed adjacent to the activated first drain extension region 134. The first sidewall spacer 123 conforms to a stack of the first gate dielectric 127 and the first gate electrode 125. A bottom portion of the first sidewall spacer 123 encompasses the activated first source extension region 132 and the activated first drain extension region 134. Accordingly, the activated first source region 130 and the activated first drain region 140 are offset from the first sidewall spacer 123.

With regard to the NMOS region 150, the second gate structure 151 is located on the substrate 10. The carbon doped p-type well 170 is formed in the substrate 10 under the second gate structure 151. The second channel region 185, the activated second source region 180, the activated second drain region 190, the activated second source extension region 182, and the activated second drain extension region 184 are formed within the carbon doped p-type well 170. Further, the second channel region 185 is disposed under the second gate dielectric 156. The activated second source region 180 and the activated second drain region 190 are disposed on opposite sides of the second channel region 185. The activated second source extension region 182 and the activated second drain extension region 184 are also disposed on opposite sides of the second channel region 185. Moreover, the activated second source region 180 is disposed adjacent to the activated second source extension region 182, and the activated second drain region 190 is disposed adjacent to the activated second drain extension region 184. The second sidewall spacer 152 conforms to a stack of the second gate electrode 154 and the second gate dielectric 156. A bottom portion of the second sidewall spacer 152 encompasses the activated second source extension region 182 and the activated second drain extension region 184. Accordingly, the activated second source region 180 and the activated second drain region 190 are offset from the second sidewall spacer 152.

In some embodiments, the first and second gate dielectrics (127, 156) include silicon dioxide or, in an alternative embodiment, a high dielectric constant (K) material. In some embodiments, the first and second gate dielectrics (127, 156) include a dielectric material based on silicon oxide, e.g., silicon oxynitride, silicon oxide, or a stack of at least one silicon oxide and at least one silicon nitride. In some embodiments, the first and second gate dielectrics (127, 156) include a dielectric metal oxide having a dielectric constant greater than 8.0, which is known as high-k dielectric materials. Exemplary high-k dielectric materials include $HfO_2$, $ZrO_2$, $La_2O_3$, $Al_2O_3$, $TiO_2$, $SrTiO_3$, $LaAlO_3$, $Al_2O_xN_y$, $Y_2O_3$, $LaAlO_xN_y$, $HfO_xN_y$, $ZrO_xN_y$, $La_2O_xN_y$, $TiO_xN_y$, $SrTiO_xN_y$, $Y_2O_xN_y$, and an alloy thereof. Each value of x is independently from 0.1 to 3.0 and each value of y is independently from 0.1 to 2.0. Thickness of the first and second gate dielectrics (127, 156) is substantially the same.

In some embodiments, the first and second gate electrodes (125, 154) include standard polysilicon. In some embodiments, the first and second gate electrodes (125, 154) include amorphous polysilicon material, a metal material, silicided metal material, or a stack of at least one metallic material and at least one semiconductor material. The thickness of the first gate electrode 125 is substantially the same as the thickness of the second gate electrode 154. The first and second gate electrodes (125, 154) serve as a local interconnection with other devices. The material is chosen to meet the requirement of resistance.

In some embodiments, the first and second sidewall spacers (123, 152) include silicon nitride. In some embodiments, the first and second sidewall spacers (123, 152) include silicon dioxide, silicon carbide, or silicon oxynitride, without limitation. The first and second sidewall spacers (123, 152) are respectively located on opposing sides of the first gate electrode 125 and the second gate electrode 154. The first and second sidewall spacers (123, 152) are configured as a mask to shield the activated extension source/drain regions (132, 134, 182, 184) during formation of the activated source/drain regions (130, 140, 180, 190).

In some embodiments, the activated first source region 130 and the activated first drain region 140 are implanted or diffused to form a p-type region. The doping material includes boron, germanium, and/or indium. In some embodiments, the activated second source region 180 and the activated second drain region 190 are implanted or diffused to form an n-type region. The doping material includes phosphorous, arsenic, and/or antimony. In some embodiments, the activated source/drain regions (130, 140, 180, 190) are U-shaped structures diffused into the substrate 10 in a lateral view. In some embodiments, the activated source/drain regions (130, 140, 180, 190) are typically diffused into few nanometers and substantially uniform. In some embodiments, the activated source/drain regions (130, 140, 180, 190) are recessed out and deposited regions. A recessed and deposited region includes germanium or carbon, which provides a tensile or a compress strain to the first and second channel regions (135, 185).

In some embodiments, the activated first source extension region 132 and the activated first drain extension region 134 are p-type regions. Moreover, the activated second source extension region 182 and the activated second drain extension region 184 are n-type regions. The activated source/drain extension regions (132, 134, 182, 184) are lightly doped (LDD), medium doped (MDD), or heavily doped (HDD) extension regions. The extension regions can adjust an electric field in the first and second channel regions (135, 185).

The carbon doped n-type well 120 includes dopants, for example, phosphorous, arsenic, and/or antimony. The carbon doped p-type well 170 includes dopants, for example, boron, germanium, and/or indium. Since the carbon doped wells (120, 170) are foundations for manufacturing devices, the first and second channel regions (135, 185) obtain features of these wells. The carbon doped wells (120, 170) function to block diffused dopants from the activated extension source/drain regions (132, 134, 182, 184) and the activated source/drain regions (130, 140, 180, 190). Carbon in the carbon doped wells (120, 170) can control the diffusion distance of activated dopants. Accordingly, the profile of the activated source/drain regions (130, 140, 180, 190) can be better defined. Since dopants in the activated source/drain regions (130, 140, 180, 190) cannot penetrate into the first and second channel regions (135, 185), electrical properties of the semiconductor device 100 can be controlled.

In some embodiments, the activated source/drain regions (130, 140, 180, 190) and the activated extension source/drain regions (132, 134, 182, 184) are heavily or medium doped with boron. However, boron has a lower atomic weight and a longer diffused length compared with other dopants. As a result, during a thermal process, boron in source/drain regions will easily diffuse into a channel region. Nevertheless, it is difficult to control the diffusion distance of boron and hence, the device uniformity. Electrical properties of the device, for example, threshold voltage and saturation current, are altered and deviated from a desired value. This phenomenon causes poor threshold voltage uniformity among devices. With a carbon doped well, the diffusion distance of boron is reduced. Thus, the channel region of a device can be protected from an invasion of boron. In some embodiments, a carbon doped well also efficiently curbs an invasion of other dopants, for example, phosphorous, arsenic, antimony, germanium, or indium.

When comparing carbon concentration with other dopants in the carbon doped wells (120, 170), the composition ratio is as follows. In some embodiments, the atomic carbon concentration in the dopants ranges from approximately 0.1% to 10%.

In some embodiments, the carbon concentration in the carbon doped wells (120, 170) gradually increases from the bottom-most to the top-most of the well regions. In some embodiments, the carbon concentration in the carbon doped wells (120, 170) is substantially uniform in the entire well region. In some embodiments, the carbon concentration in the carbon doped wells (120, 170) gradually increases from the top-most to the bottom-most of the well regions.

Figure 2:
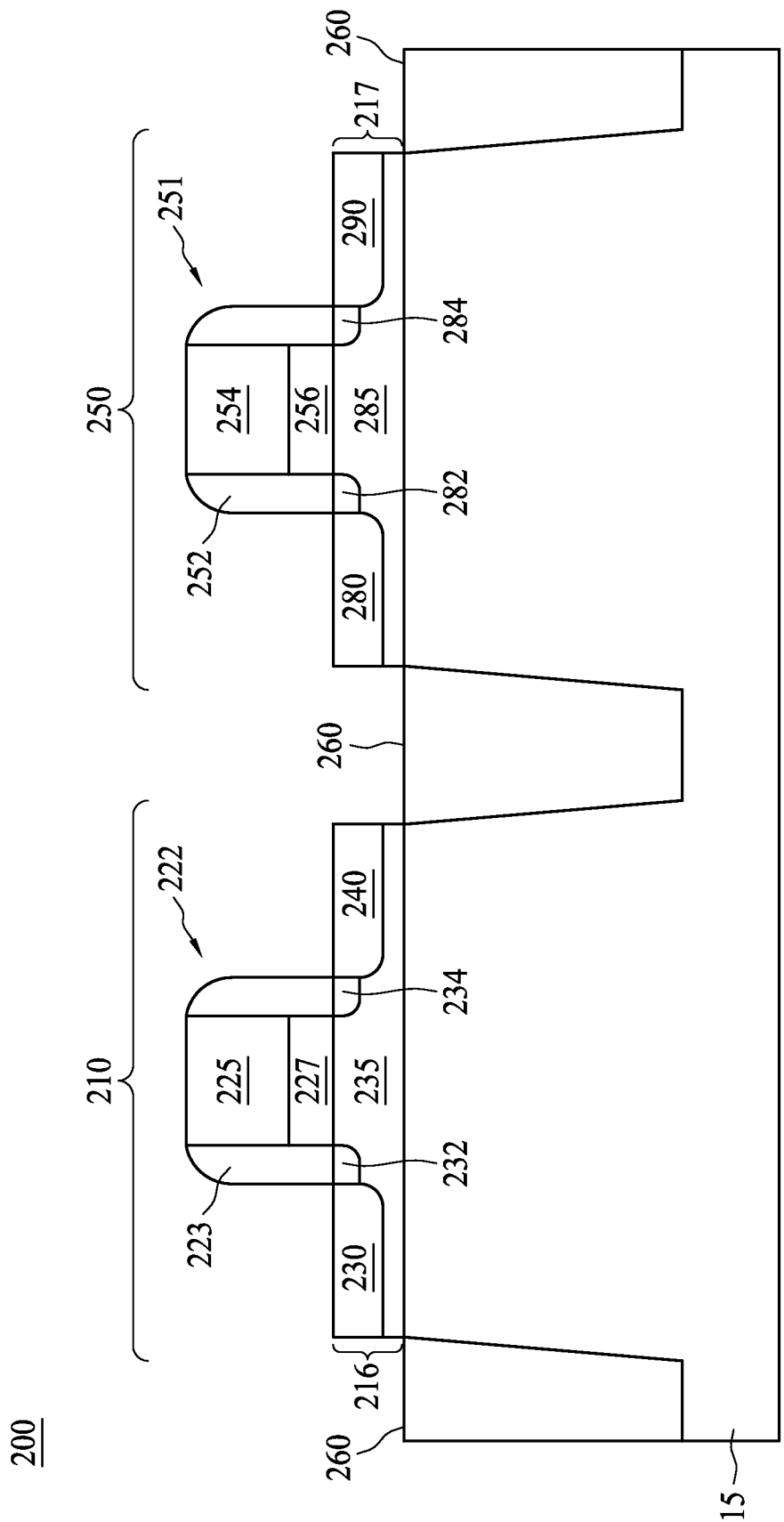
FIG. 2 is a semiconductor device in accordance with some embodiments of the present disclosure.

FIG. 2 is a semiconductor device 200 in accordance with some embodiments of the present disclosure. The semiconductor device 200 is formed on a substrate 15. The substrate 15 is a silicon substrate or an SOI substrate. The semiconductor device 200 includes a p-type metal oxide semiconductor (PMOS) region 210 and an n-type metal oxide semiconductor (NMOS) region 250. Dielectric isolations 260 are located between the PMOS region 210 and the NMOS region 250.

The PMOS region 210 includes a carbon doped epitaxial layer 216, a first gate structure 222, a first channel region 235, an activated first source region 230, an activated first drain region 240, an activated first source extension region 232, and an activated first drain extension region 234. The first gate structure 222 further includes a first gate electrode 225, a first gate dielectric 227, and a first sidewall spacer 223.

The NMOS region 250 includes a carbon doped epitaxial layer 217, a second gate structure 251, a second channel region 285, an activated second source region 280, an activated second drain region 290, an activated second source extension region 282, and an activated second drain extension region 284. The second gate structure 251 further includes a second gate electrode 254, a second gate dielectric 256, and a second sidewall spacer 252.

With regard to the PMOS region 210, the carbon doped epitaxial layer 216 is formed on the substrate 15. The carbon doped epitaxial layer 216 does not overlap with the dielectric isolations 260. The first gate structure 222 is located on the carbon doped epitaxial layer 216. The first channel region 235, the activated first source region 230, the activated first drain region 240, the activated first source extension region 232, and the activated first drain extension region 234 are formed within the carbon doped epitaxial layer 216. Accordingly, the first channel region 235 is disposed under the first gate dielectric 227. The activated first source region 230 and the activated first drain region 240 are disposed on opposite sides of the first channel region 235. The activated first source extension region 232 and the activated first drain extension region 234 are also disposed on opposite sides of the first channel region 235. The activated first source region 230 is disposed adjacent to the activated first source extension region 232. In addition, the activated first drain region 240 is disposed adjacent to the activated first drain extension region 234. The first sidewall spacer 223 conforms to a stack of the first gate dielectric 227 and the first gate electrode 225. A bottom portion of the first sidewall spacer 223 encompasses the activated first source extension region 232 and the activated first drain extension region 234. Accordingly, the activated first source region 230 and the activated first drain region 240 are offset from the first sidewall spacer 223.

With regard to the NMOS region 250, the carbon doped epitaxial layer 217 is located on the substrate 15. The carbon doped epitaxial layer 217 does not overlap with the dielectric isolations 260. The second gate structure 251 is located on the carbon doped epitaxial layer 217. The second channel region 285, the activated second source region 280, the activated second drain region 290, the activated second source extension region 282, and the activated second drain extension region 284 are formed within the carbon doped epitaxial layer 217. Accordingly, the second channel region 285 is disposed under the second gate dielectric 256. The activated second source region 280 and the activated second drain region 290 are disposed on opposite sides of the second channel region 285. The activated second source extension region 282 and the activated second drain extension region 284 are also disposed on opposite sides of the second channel region 285. The activated second source region 280 is disposed adjacent to the activated second source extension region 282. In addition, the activated second drain region 290 is disposed adjacent to the activated second drain extension region 284. The second sidewall spacer 252 conforms to a stack of the second gate electrode 254 and the second gate dielectric 256. A bottom portion of the second sidewall spacer 252 encompasses the activated second source extension region 282 and the activated second drain extension region 284. Accordingly, the activated second source region 280 and the activated second drain region 290 are offset from the second sidewall spacer 252.

In some embodiments, the first and second gate dielectrics (227, 256) are similar to the first and second gate dielectrics (127, 156) described and illustrated with reference to FIG. 1. The first and second gate dielectrics (227, 256) include silicon dioxide or, in an alternative embodiment, a high dielectric constant (K) material. In some embodiments, the first and second gate dielectrics (227, 256) include a dielectric material based on silicon oxide, e.g., silicon oxynitride, silicon oxide, or a stack of at least one silicon oxide and at least one silicon nitride.

Moreover, the first and second gate electrodes (225, 254) are similar to the first and second gate electrodes (125, 154). In some embodiments, the first and second gate electrodes (225, 254) include standard polysilicon. In some embodiments, the first and second gate electrodes (225, 254) include amorphous polysilicon material, a metal material, silicided metal material, or a stack of at least one metallic material and at least one semiconductor material.

In some embodiments, the first and second sidewall spacers (223, 252) include silicon nitride. In some embodiments, the first and second sidewall spacers (223, 252) include silicon dioxide, silicon carbide, or silicon oxynitride, without limitation. The first and second sidewall spacers (223, 252) are respectively located on sidewalls of the first gate electrode 225 and the second gate electrode 254. The first and second sidewall spacers (223, 252) are configured as a mask to shield the activated extension source/drain regions (232, 234, 282, 284) during formation of the activated source/drain regions (230, 240, 280, 290).

In some embodiments, the activated first source region 230 and the activated first drain region 240 are implanted or diffused to form a p-type region. The doping material includes boron, germanium, and/or indium. In some embodiments, the activated second source region 280 and the activated second drain region 290 are implanted or diffused to form an n-type region. The doping material includes phosphorous, arsenic, and/or antimony. In some embodiments, the activated source/drain regions (230, 240, 280, 290) are U-shaped structures diffused into the carbon doped epitaxial layers (216, 217). In some embodiments, the activated source/drain regions (230, 240, 280, 290) are typically diffused into few nanometers and substantially uniform. In some embodiments, the activated source/drain regions (230, 240, 280, 290) are recessed out and deposited regions. A recessed and deposited region includes germanium or carbon, which provides a tensile or a compress strain to the first and second channel regions (235, 285).

In some embodiments, the activated first source extension region 232 and the activated first drain extension region 234 are p-type regions. Moreover, the activated second source extension region 282 and the activated second drain extension region 284 are n-type regions. The activated source/drain extension regions (232, 234, 282, 284) are lightly doped (LDD), medium doped (MDD), or heavily doped (HDD) extension regions. The extension regions can adjust an electric field in the first and second channel regions (235, 285).

The carbon doped epitaxial layer 216 is a silicon base including dopants, for example, phosphorous, arsenic, and/or antimony. The carbon doped epitaxial layer 217 is a silicon base including dopants, for example, boron, germanium, and/or indium. Since the carbon doped epitaxial layers (216, 217) are foundations for manufacturing devices, the first and second channel regions (235, 285) obtain features of these layers. An advantage of the carbon doped epitaxial layers (216, 217) is to block diffused dopants from the activated extension source/drain regions (232, 234, 282, 284) and the activated source/drain regions (230, 240, 280, 290). Carbon in the carbon doped epitaxial layers (216, 217) can control the diffusion distance of dopants. Accordingly, the profile of the activated source/drain regions (230, 240, 280, 290) can be better defined. Since dopants of the activated source/drain regions (230, 240, 280, 290) cannot penetrate into the first and second channel regions (235, 285), electrical properties of the semiconductor device 200 can be controlled.

A carbon epitaxial layer is advantageous in that atoms of silicon or carbon are well arranged. High quality and less dislocation of lattice is obtained compared to deposition. Meanwhile, by using the carbon epitaxial layer, the diffusion distance of dopants from source/drain regions is reduced. Thus, the channel region of a semiconductor device is protected from invasion of dopants during subsequent thermal treatments. Electrical properties are not altered by dopant diffusion and thus can be easily controlled.

When comparing carbon concentration with other dopants in the first and second channel regions (235, 285), the composition ratio is as follows. In some embodiments, the atomic carbon concentration in the dopants ranges from approximately 0.1% to 10%.

In some embodiments, the carbon concentration in the carbon doped epitaxial layers (216, 217) gradually increases from the bottom-most to the top-most of the well regions. In some embodiments, the carbon concentration in the carbon doped epitaxial layers (216, 217) is substantially uniform in the entire well region. In some embodiments, the carbon concentration in the carbon doped epitaxial layers (216, 217) gradually increases from the top-most to the bottom-most of the well regions.

In some embodiments, the carbon doped epitaxial layers (216, 217) are disposed adjacent to the dielectric isolations 260 without overlapping and contacting each other. If implanted with carbon, silicon oxide of the dielectric isolations 260 becomes carbon-doped silicon oxide. Carbon-doped silicon oxide is susceptible to wet etches or cleaning chemistries. Since the carbon doped epitaxial layers (216, 217) are not in contact with the dielectric isolations 260, carbon will not penetrate into the dielectric isolations 260. The dielectric isolations 260 are kept in good shape and will not dissolve by wet chemistries.

Figure 3A:
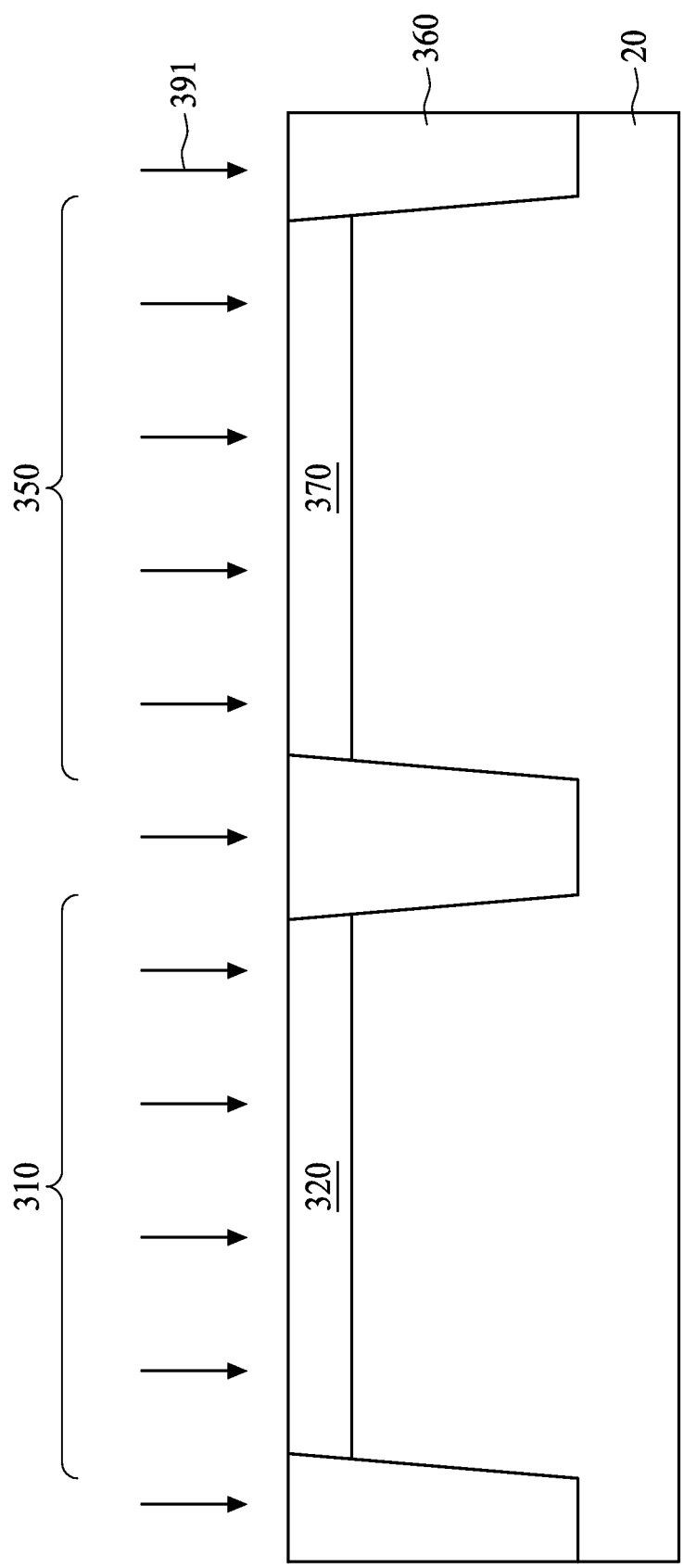
FIGS. 3A-3I are cross-sectional diagrams illustrating a manufacturing process of the semiconductor device of FIG. 1 in accordance with some embodiments of the present disclosure.

FIGS. 3A-3I are cross-sectional diagrams illustrating a manufacturing process of the semiconductor device 100 of FIG. 1 in accordance with some embodiments of the present disclosure. Referring to FIG. 3A, a substrate 20 is prepared. The substrate 20 includes dielectric isolations 360 configured to define a first active region 310 and a second active region 350. In some embodiments, the dielectric isolations 360 are shallow trench isolation structures. In other embodiments, the dielectric isolations 360 are local oxidation of silicon (LOCOS) isolation structures. Persons of ordinary skill in the art may understand the various steps used to form the dielectric isolations 360.

Next, a first implantation 391 is performed. For example, an ion implantation or a small or large batch furnace-based process is used. Carbon ions are implanted into the substrate 20. A carbon dose ranges from about 1E11 to 1E19 atoms/cm$^2$ and at a voltage ranging from about 10 kilo electron volts (keV) to about 500 keV. A depth of these carbon ions is between 10 to 80 angstroms. The first implantation 391 is used to form a first carbon doped region 320 and a second carbon doped region 370. The first carbon doped region 320 is formed in the first active region 310. The second carbon doped region 370 is formed in the second active region 350.

Figure 3B:
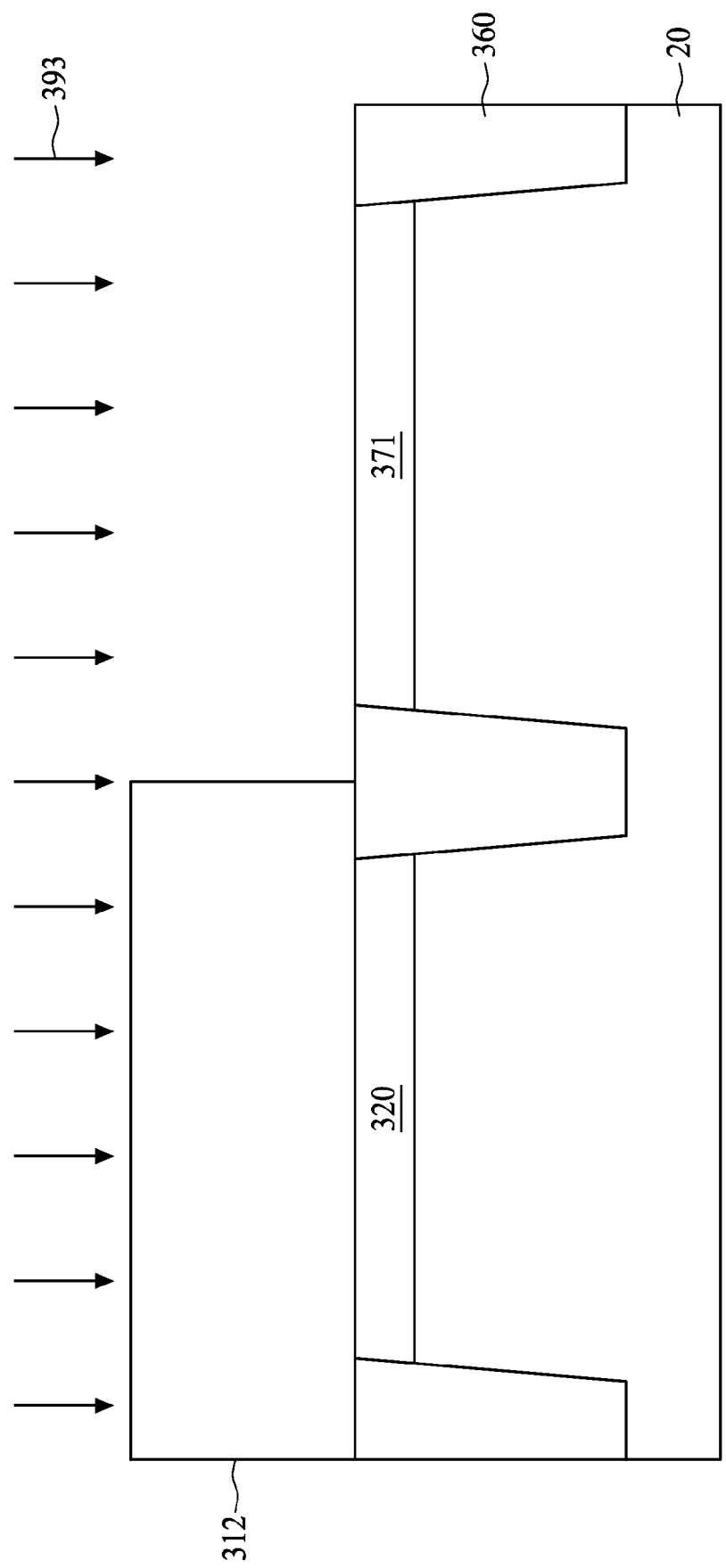

Referring to FIG. 3B, a first photoresist layer 312 is deposited and patterned to cover the first active region 310. The second carbon doped region 370 is exposed and ready to form a carbon doped p-type region 371. Later, a second implantation 393 is performed. The second implantation 393 includes p-type dopants such as boron, germanium, or indium. In this embodiment, phosphorous ions are implanted into the second carbon doped region 370 so as to form the carbon doped p-type region 371.

Figure 3C:
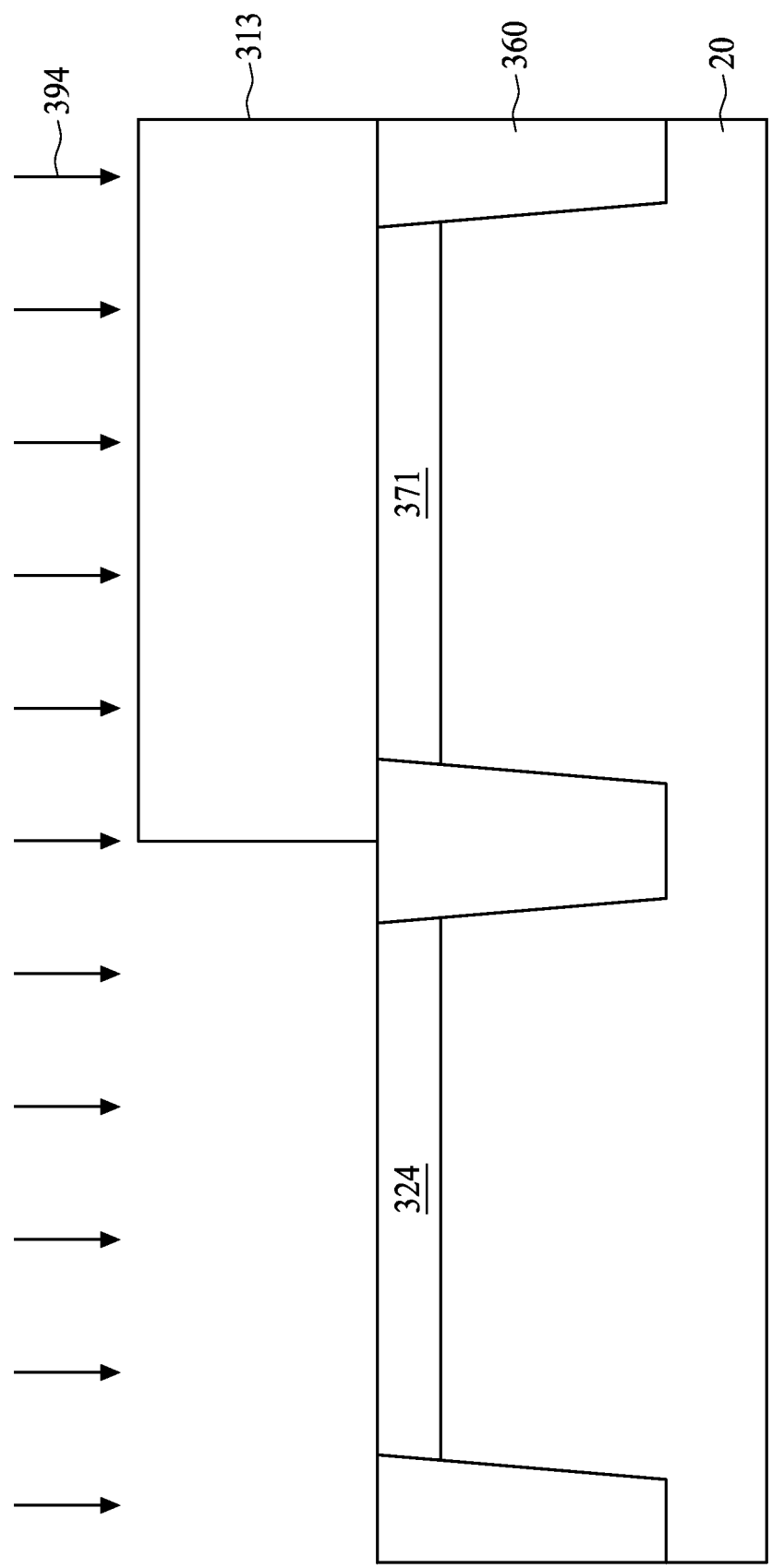

The first photoresist layer 312 is then removed. Referring to FIG. 3C, a second photoresist layer 313 is deposited and patterned to cover the carbon doped p-type region 371. The first carbon doped region 320 is exposed and ready to form a carbon doped n-type region 324. Later, a third implantation 394 is performed. The second implantation 394 includes n-type dopants such as phosphorous, arsenic, or antimony. In this embodiment, boron ions are implanted into the first carbon doped region 320 so as to form the carbon doped n-type region 324.

Figure 3D:
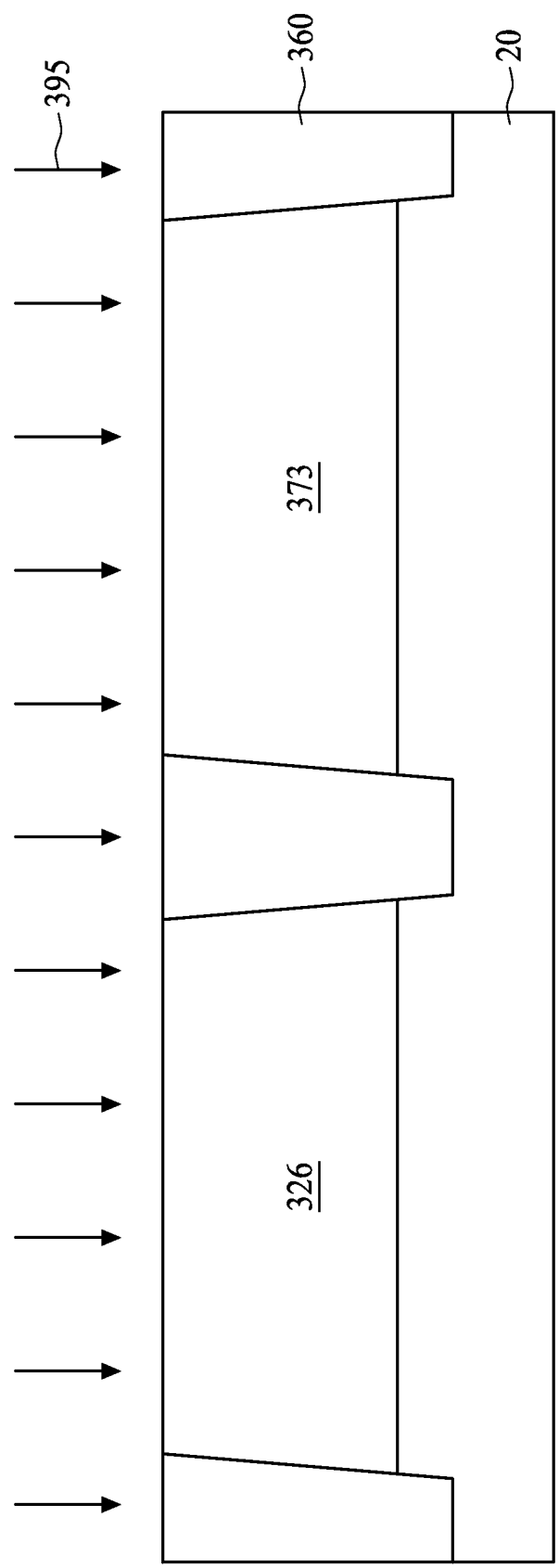

The second photoresist layer 313 is then removed. Referring to FIG. 3D, an annealing process 395 is employed to activate dopants in the carbon doped n-type region 324 and the carbon doped p-type region 371. In some embodiments, the substrate 20 is subjected to a thermal anneal 395 at a temperature of greater than about 800° C. for a time period ranging from about two minutes to one hour. In some embodiments, the substrate 20 is subjected to a flash anneal or laser anneal at other suitable temperatures. In some embodiments, the substrate 20 is subjected to furnace thermal heat with inert gas. Accordingly, a carbon doped n-type well 326 and a carbon doped p-type well 373 are formed. Carbon concentration in the wells (326, 373) ranges from about 0.1% to 10% within the dopants.

In some embodiments, the carbon doped wells (326, 373) are formed after formation of the dielectric isolations 360. A high temperature process is used for deposition of dielectric material and is employed regardless of whether an STI or LOCOS process is being used. Carbon dopants or other dopants shall be apart from the high temperature process. Therefore, the process of carbon doping is performed in a well loop.

Figure 3E:
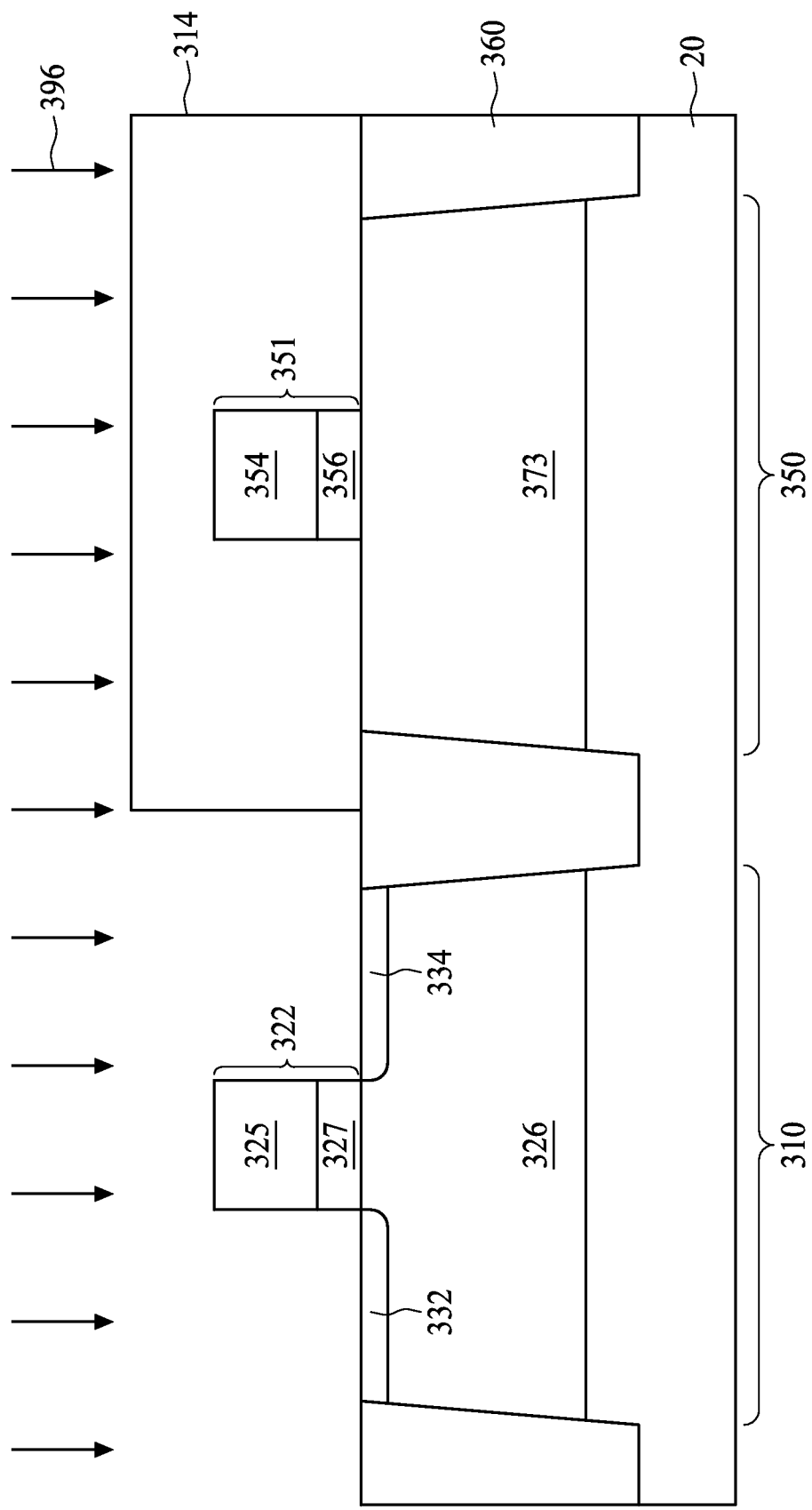

After the wells (326, 373) are formed, a stack of a gate dielectric layer and a gate electrode layer is deposited by chemical vapor deposition (CVD) or atomic layer deposition (ALD). The gate dielectric layer is formed directly on a surface of the substrate 20. The gate electrode layer is formed on the gate dielectric layer. The gate dielectric layer includes a thin, thermally grown silicon dioxide layer; however, other gate dielectrics (such as high-k dielectrics) may be formed. The gate electrode layer includes polysilicon or metal. Later, the stack is patterned and etched to form a first gate stack 322 and a second gate stack 351, as illustrated in FIG. 3E. The first gate stack 322 includes a first gate dielectric 327 and a first gate electrode 325. Similarly, the second gate stack 351 includes a second gate dielectric 356 and a second gate electrode 354.

A third photoresist layer 314 is deposited and patterned to cover the second active region 350. The first active region 310 is exposed and ready to form extension source/drain regions. A fourth implantation process 396 is performed to form a first extension source region 332 and a first extension drain region 334. The fourth implantation process 396 includes lightly doped, medium doped, or heavily doped p-type dopants. The first gate stack 322 serves to self-align the extension regions (332, 334). Thus, the first extension source/drain regions (332, 334) are disposed on opposite sides of the first gate stack 322.

Figure 3F:
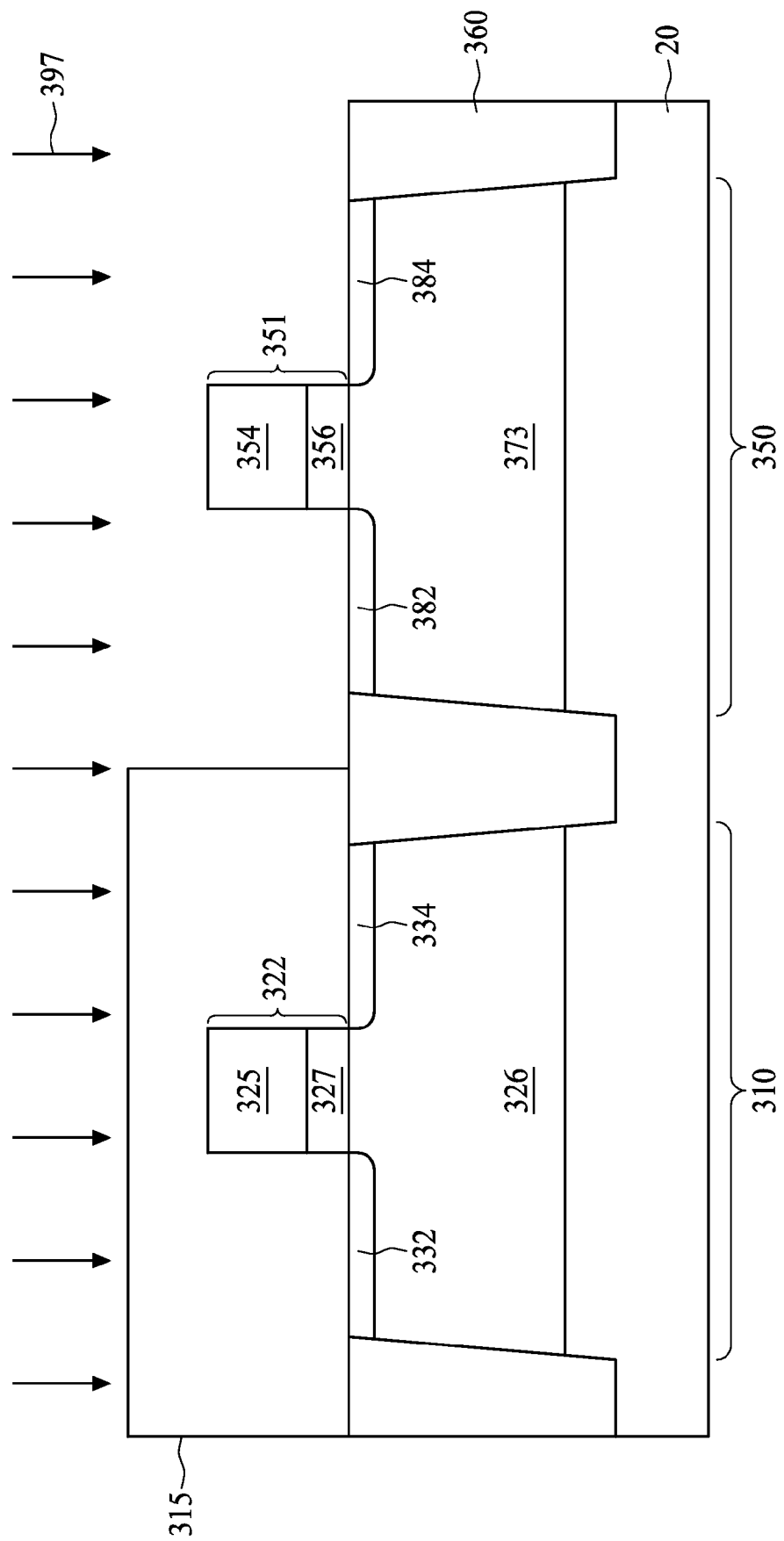

Later, the third photoresist layer 314 is removed. Referring to FIG. 3F, a fourth photoresist layer 315 is deposited and patterned to cover the first active region 310. The second active region 350 is exposed and ready to form extension source/drain regions. A fifth implantation process 397 is performed to form a second extension source region 382 and a second extension drain region 384. The fifth implantation process 397 includes lightly doped, medium doped, or heavily doped n-type dopants. The second gate stack 351 serves to self-align the second extension source/drain regions (382, 384). Thus, the extension regions (382, 384) are disposed on opposite sides of the second gate stack 351. A thermal process, such as a rapid thermal anneal, is then employed to activate the extension region dopants, which causes the first and second extension source/drain regions (332, 334, 382, 384) to diffuse laterally and slightly toward the channels.

Figure 3G:
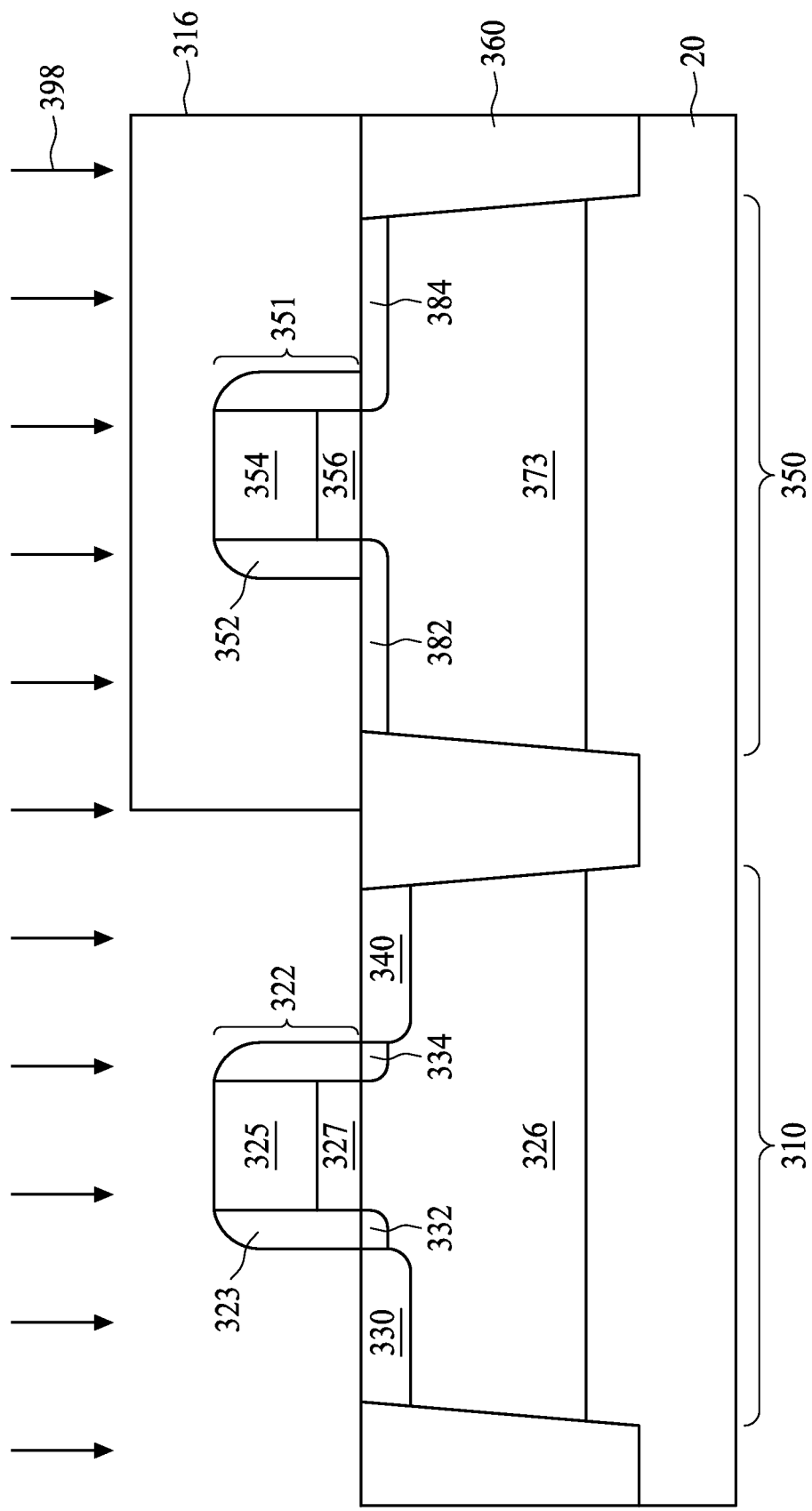

A conformal layer of gate sidewall material is deposited on the stacks (322, 351) and the substrate 20 using a CVD process with an appropriate thickness. Thereafter, the conformal layer of gate sidewall material is subjected to an anisotropic etch. A first gate sidewall spacer 323 and a second gate sidewall spacer 352 are formed as illustrated in FIG. 3G. The first and second gate sidewall spacers (323, 352) serve as a mask to protect the first and second extension source/drain regions (332, 334, 382, 384) during source/drain formation.

A fifth photoresist layer 316 is formed and patterned to cover the second active region 350. The first active region 310 is exposed and ready to form source/drain regions. A sixth implantation process 398 is performed to form a first source region 330 and a first drain region 340. The sixth implantation process 398 includes p-type dopants, such as boron. Boron concentration in the first source/drain regions (330, 340) is different from that in the first extension source/drain regions (332, 334). The first gate stack 322 and the first gate sidewall spacer 323 serve to self-align the source/drain regions (330, 340). Thus, the first source/drain regions (330, 340) are disposed on opposite sides of the first gate stack 322 and the first gate sidewall spacer 323. Accordingly, the first source/drain regions (330, 340) thus offset from an edge of the first gate sidewall spacer 323. A portion of the first extension source/drain regions (332, 334) remains laterally adjacent to the first source/drain regions (330, 340).

Figure 3H:
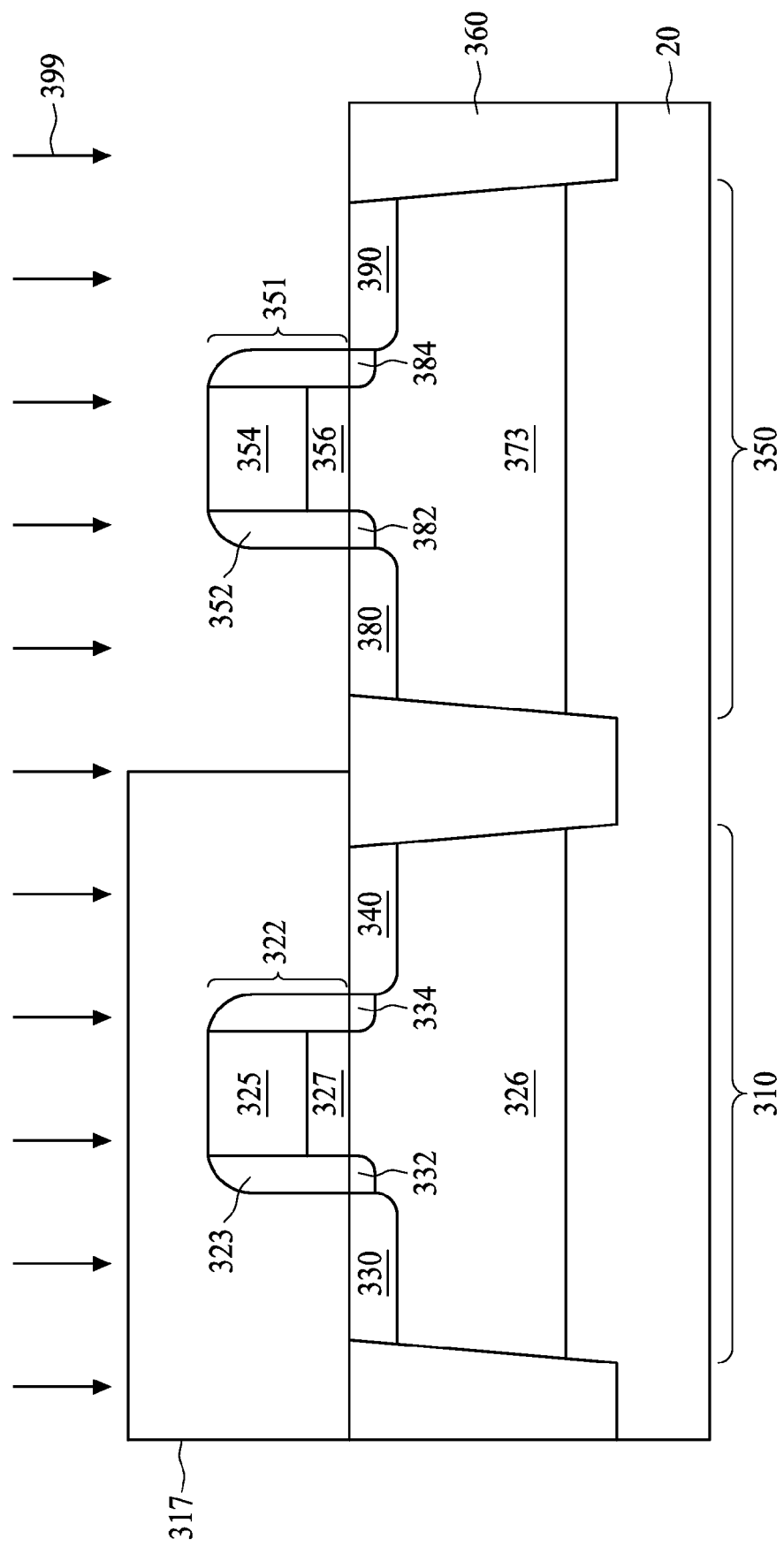

The fifth photoresist layer 316 is removed. A sixth photoresist layer 317 is formed and patterned to cover the first active region 310 as illustrated in FIG. 3H. The second active region 350 is exposed and ready to form source/drain regions. A seventh implantation process 399 is performed to form a second source region 380 and a second drain region 390. The seventh implantation process 399 includes n-type dopants, such as phosphorous. Phosphorous concentration in the second source/drain regions (380, 390) is different from that in the second extension source/drain regions (382, 384). The second gate stack 351 and the second gate sidewall spacer 352 serve to self-align the second source/drain regions (380, 390). Thus, the second source/drain regions (380, 390) are disposed on opposite sides of the second gate stack 351 and the second gate sidewall spacer 352. Accordingly, the second source/drain regions (380, 390) thus offset from an edge of the second gate sidewall spacer 352. A portion of the second extension source/drain regions (382, 384) remains adjacent to the second source/drain regions (380, 390). A thermal process, such as a rapid thermal anneal, is then employed to activate the extension region dopants, which causes the first and second source/drain regions (330, 340, 380, 390) to diffuse laterally and slightly toward the channels.

Figure 3I:
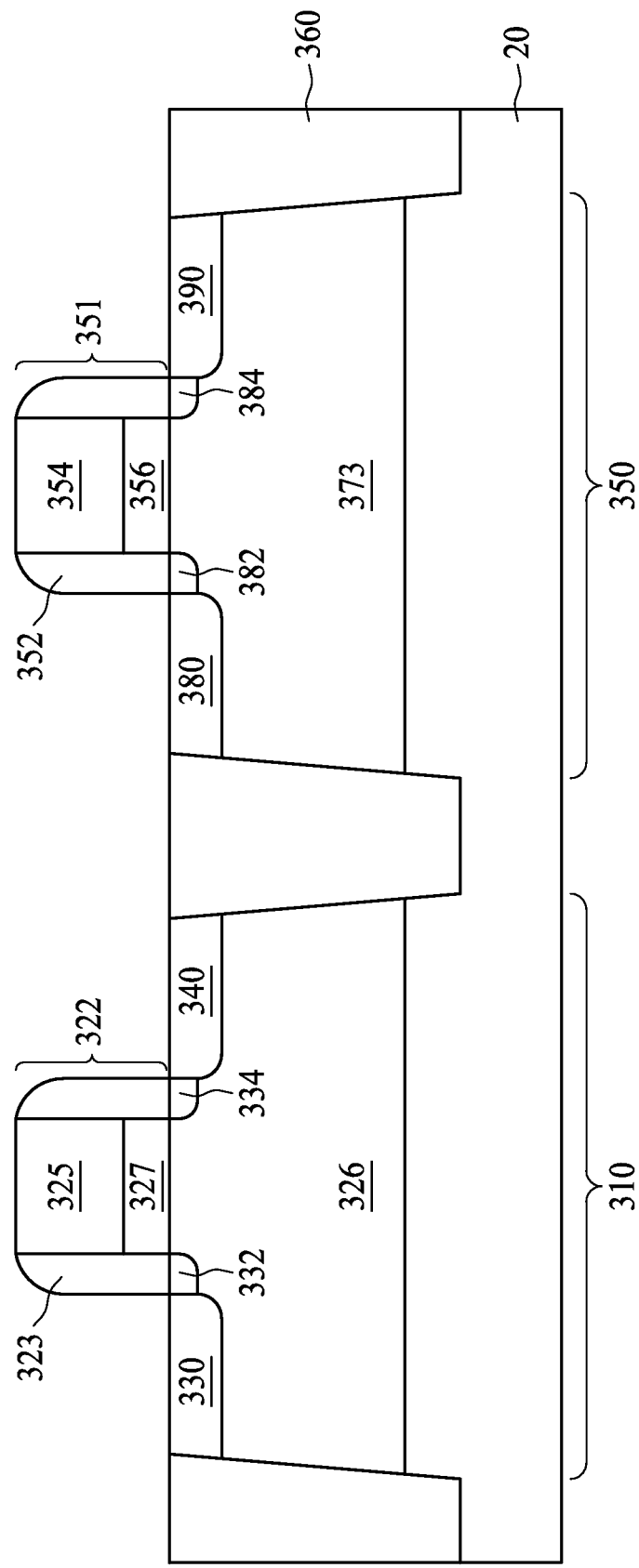

Later, the sixth photoresist layer 317 is removed. The semiconductor device 100 of FIG. 1 is accomplished as shown in FIG. 3I. The p-type metal oxide semiconductor device (PMOS) is formed on the first active region 310. The n-type metal oxide semiconductor device (NMOS) is formed on the second active region 350. Carbon doped channel regions (335, 385) have features of the carbon doped wells (326, 373). Diffusion of dopants in source/drain regions (330, 332, 334, 340, 380, 382, 384, 390) are blocked by the carbon doped wells (326, 373) during a thermal process. In addition, carbon doping in loops of well formation efficiently reduces diffusion of dopants. By means of carbon doped wells, electrical properties are controlled.

Figure 4A:
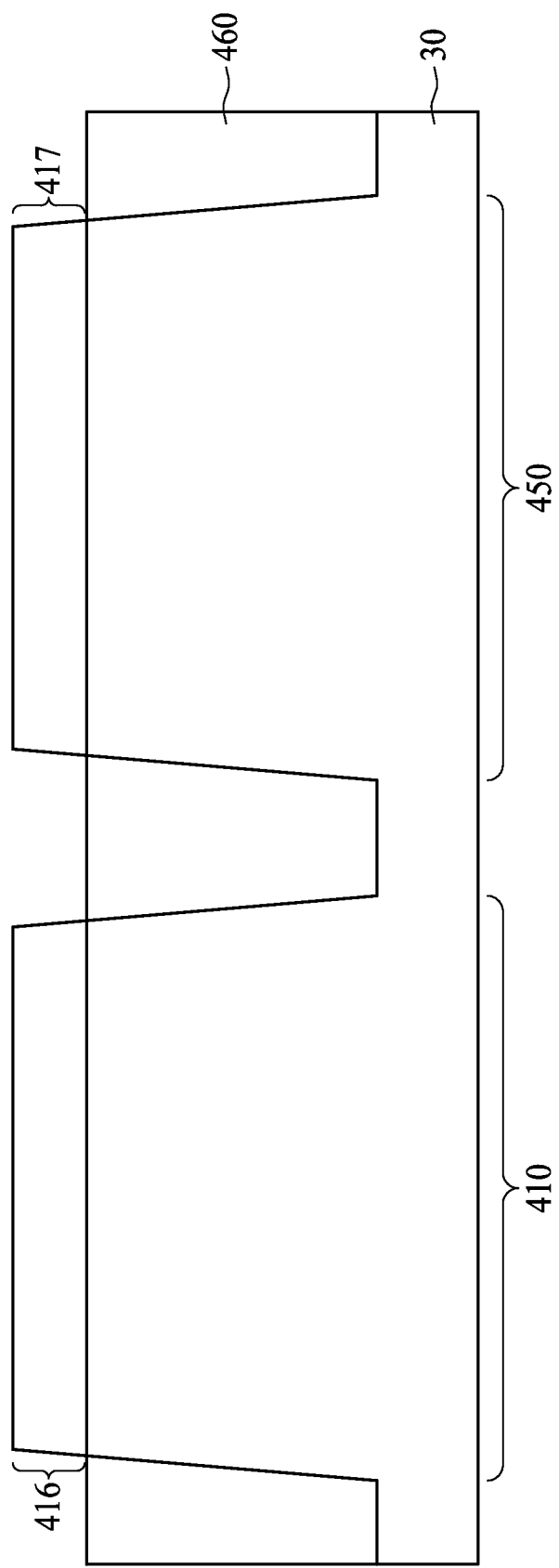
FIGS. 4A-4H are cross-sectional diagrams illustrating a manufacturing process of the semiconductor device of FIG. 2 in accordance with some embodiments of the present disclosure.

FIGS. 4A-4F are cross-sectional diagrams illustrating a manufacturing process of the semiconductor device 200 of FIG. 2 in accordance with some embodiments of the present disclosure. The semiconductor device 200 is similar to the semiconductor device 100. The difference depicts that devices are all formed in a carbon doped epitaxial layer in the semiconductor device 200. Referring to FIG. 4A, a substrate 30 having dielectric isolations 460 configured to define a first active region 410 and a second active region 450 is prepared. The dielectric isolations 460 are the same as the dielectric isolations 360 in FIG. 1. A first carbon doped epitaxial layer 416 is formed on the first active region 410. A second carbon doped epitaxial layer 417 is formed on the second active region 450. The carbon doped epitaxial layers (416, 417) are epitaxial silicon bases having carbon dopants. In some embodiments, a molecular beam epitaxy (MBE) process having carbide gas is performed. In some embodiments, a selective epitaxial process is employed to form the carbon doped epitaxial layers (416, 417) on the first and second active regions (410, 450). The carbon doped epitaxial layers (416, 417) are disposed adjacent to the dielectric isolations 460 without overlapping and contacting each other.

Figure 4B:
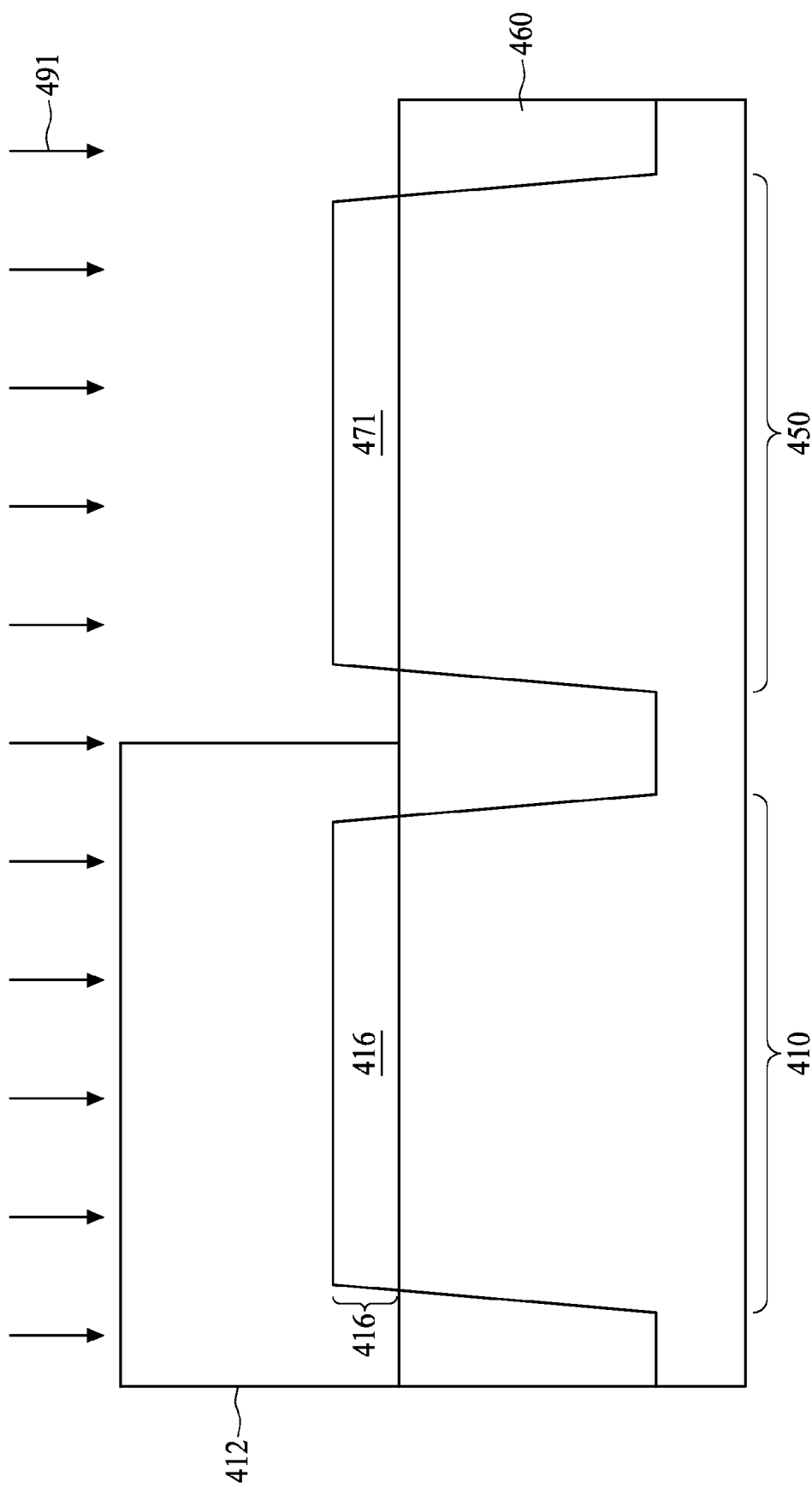

Referring to FIG. 4B, a first photoresist layer 412 is deposited and patterned to cover the first active region 410. The second active region 450 is exposed and ready to form a carbon doped p-type region 471. Later, a first implantation 491 is performed. The first implantation 491 includes p-type dopants such as boron, germanium, or indium. In this embodiment, boron ions are implanted into the second carbon doped epitaxial layer 417 so as to form the carbon doped p-type region 471.

Figure 4C:
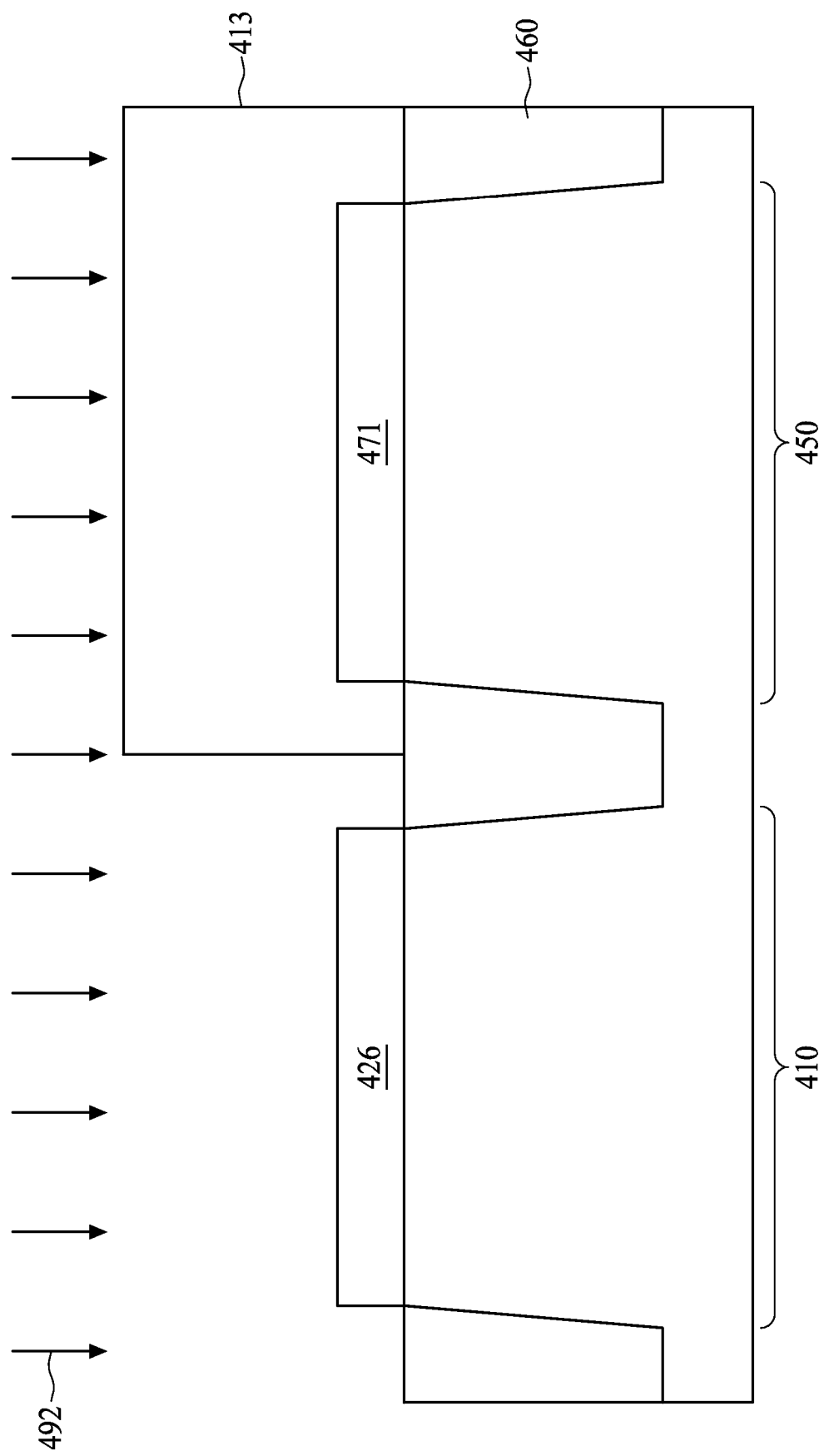

The first photoresist layer 412 is then removed. Referring to FIG. 4C, a second photoresist layer 413 is deposited and patterned to cover the second active region 450. The first active region 410 is exposed and ready to form a carbon doped n-type region 426. Later, a second implantation 492 is performed. The second implantation 492 includes n-type dopants such as phosphorous, arsenic, or antimony. In this embodiment, phosphorous ions are implanted into the first carbon doped epitaxial layer 416 so as to form the carbon doped n-type region 426. Later, the second photoresist layer 413 is removed. A thermal process, such as a rapid thermal anneal, is then employed to activate the dopants of the carbon doped regions (426, 471).

Figure 4D:
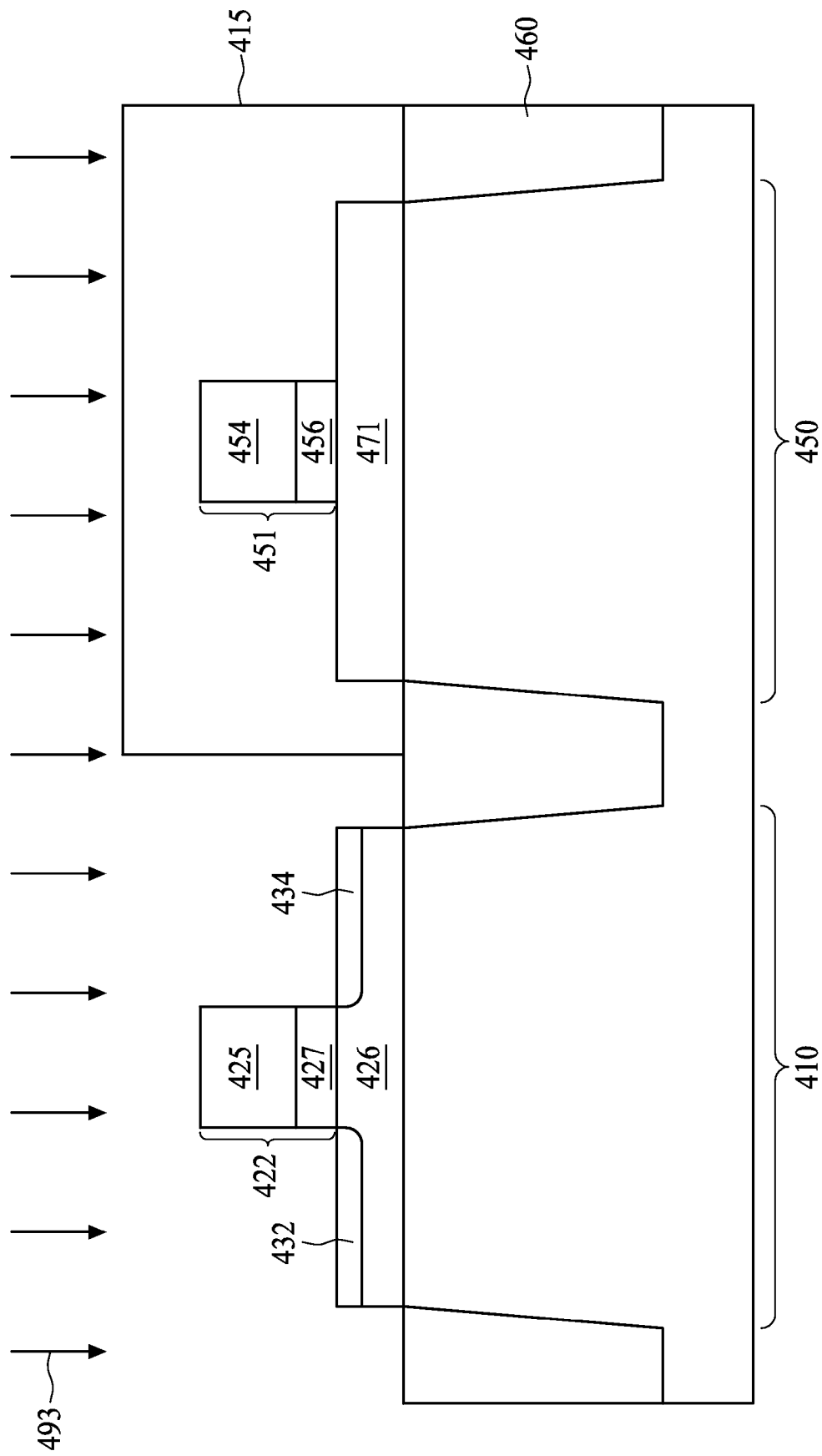

The operation of FIG. 4D is similar to the operation of FIG. 3E. A first gate stack 422 and a second gate stack 451 are formed as illustrated in FIG. 4D. The first gate stack 422 includes a first gate dielectric 427 and a first gate electrode 425. Similarly, the second gate stack 451 includes a second gate dielectric 456 and a second gate electrode 454.

A third photoresist layer 415 is deposited and patterned to cover the second active region 450. The first active region 410 is exposed and ready to form extension source/drain regions. A third implantation process 493 is performed to form a first extension source region 432 and a first extension drain region 434. The third implantation process 493 includes lightly doped, medium doped, or heavily doped p-type dopants. The first gate stack 422 serves to self-align the first extension source/drain regions (432, 434). Thus, the first extension source/drain regions (432, 434) are disposed on opposite sides of the first gate stack 422.

Figure 4E:
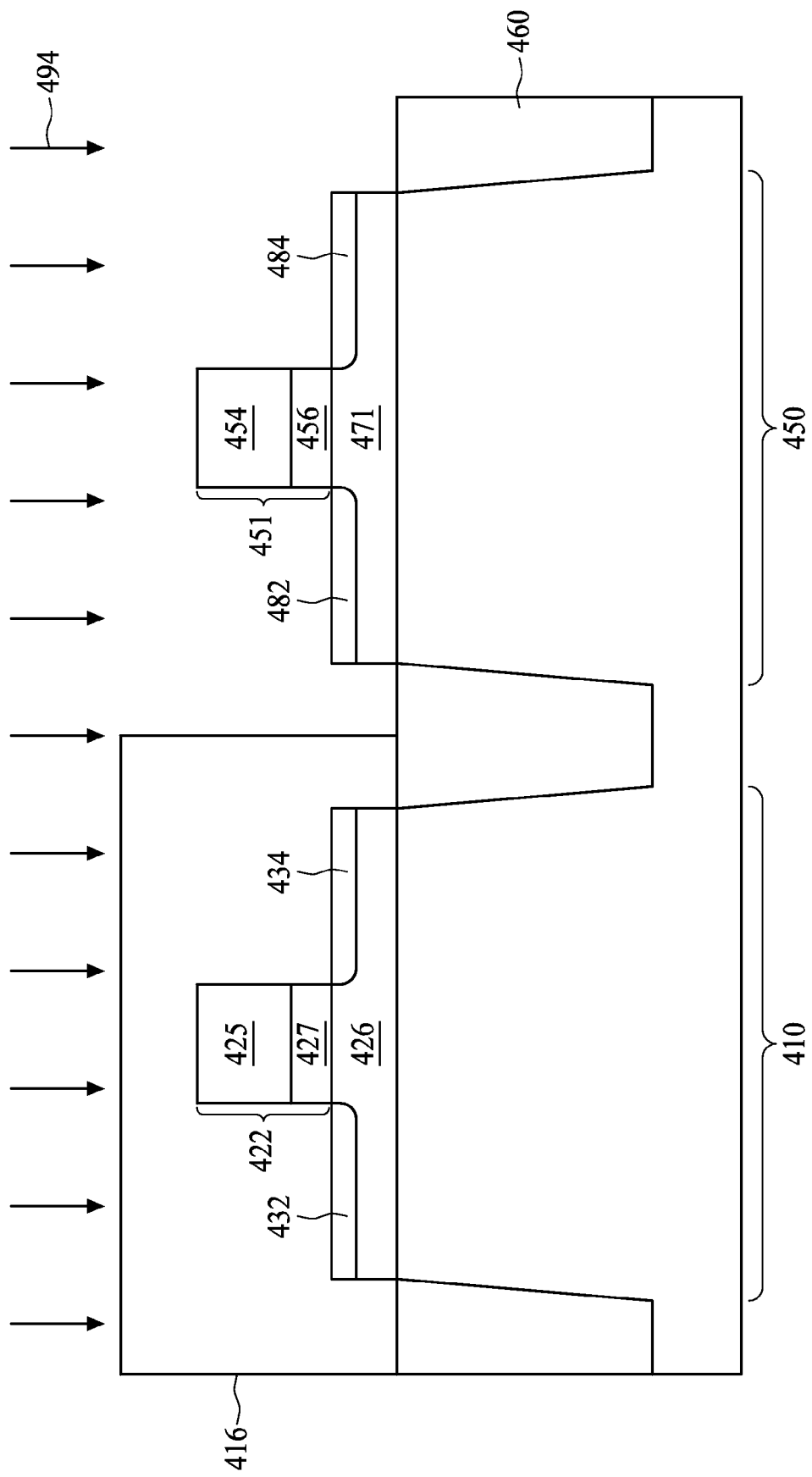

Next, the third photoresist layer 415 is removed. Referring to FIG. 4E, a fourth photoresist layer 416 is deposited and patterned to cover the first active region 410. The operation of 4E is similar to the operation of FIG. 3F. The second active region 450 is exposed and ready to form extension source/drain regions. A fourth implantation process 494 is performed to form a second extension source region 482 and a second extension drain region 484. The fourth implantation process 494 includes lightly doped, medium doped, or heavily doped n-type dopants. The second gate stack 451 serves to self-align the second extension source/drain regions (482, 484). Thus, the extension regions (482, 484) are disposed on opposite sides of the second gate stack 451. A thermal process, such as a rapid thermal anneal, is then employed to activate the extension region dopants, which causes the first and second extension source/drain regions (432, 434, 482, 484) to diffuse laterally and slightly toward the channels.

Figure 4F:
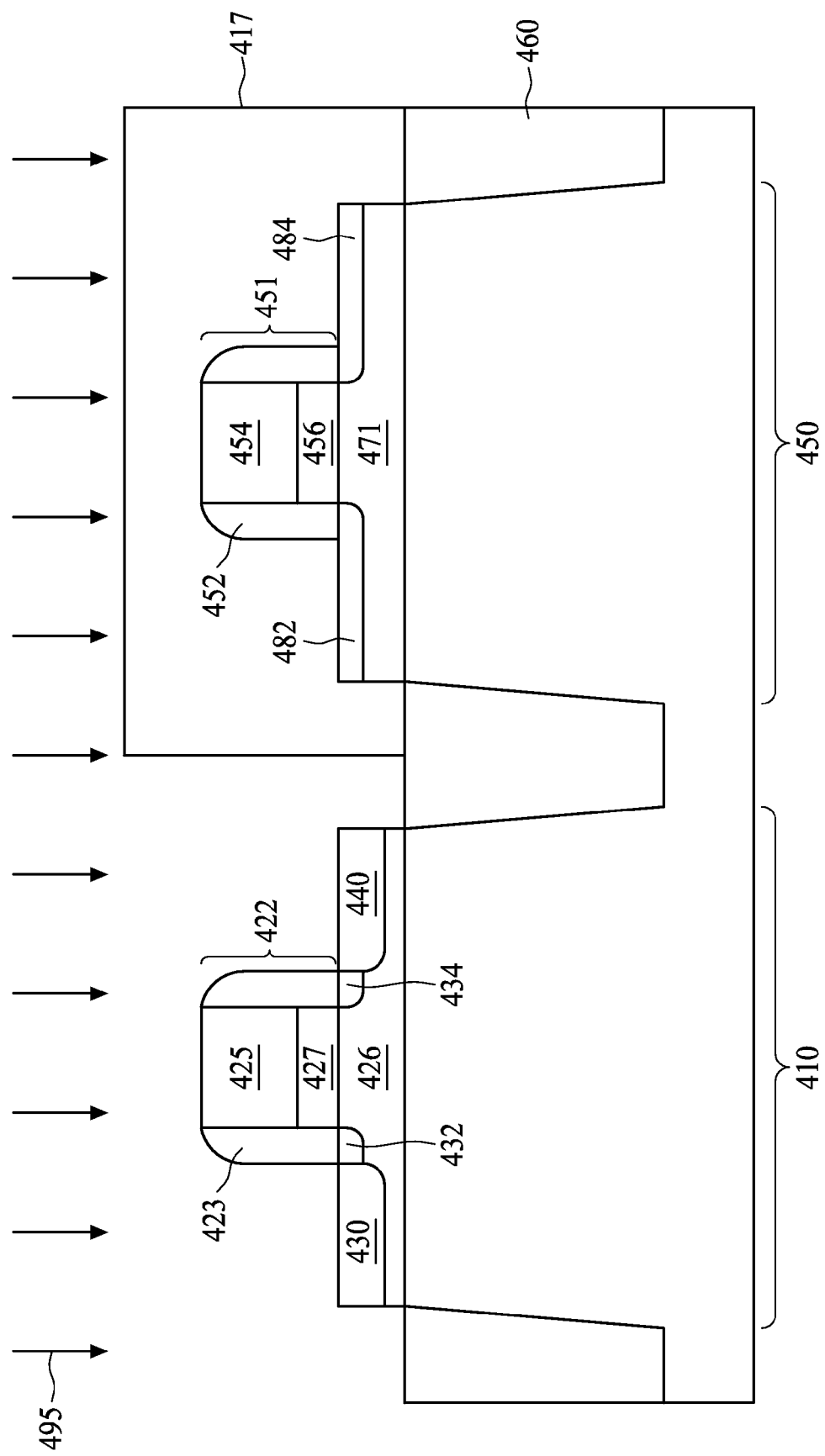

The operation of FIG. 4F is similar to the operation of FIG. 3G. Thus, a first gate sidewall spacer 423 and a second gate sidewall spacer 452 are formed as illustrated in FIG. 4F.

A fifth photoresist layer 417 is formed and patterned to cover the second active region 450. The first active region 410 is exposed and ready to form source/drain regions. A fifth implantation process 495 is performed to form a first source region 430 and a first drain region 440. The fifth implantation process 495 includes p-type dopants, such as boron. Boron concentration in source/drain regions (430, 440) is different from that in the first extension source/drain regions (432, 434). The first gate stack 422 and the first gate sidewall spacer 423 serve to self-align the first source/drain regions (430, 440). Thus, the first source/drain regions (430, 440) are formed on opposite sides of the first gate stack 422. Accordingly, the first source/drain regions (430, 440) thus offset from an edge of the first gate sidewall spacer 423. A portion of the first extension source/drain regions (432, 434) remains adjacent to the first source/drain regions (430, 440).

Figure 4G:
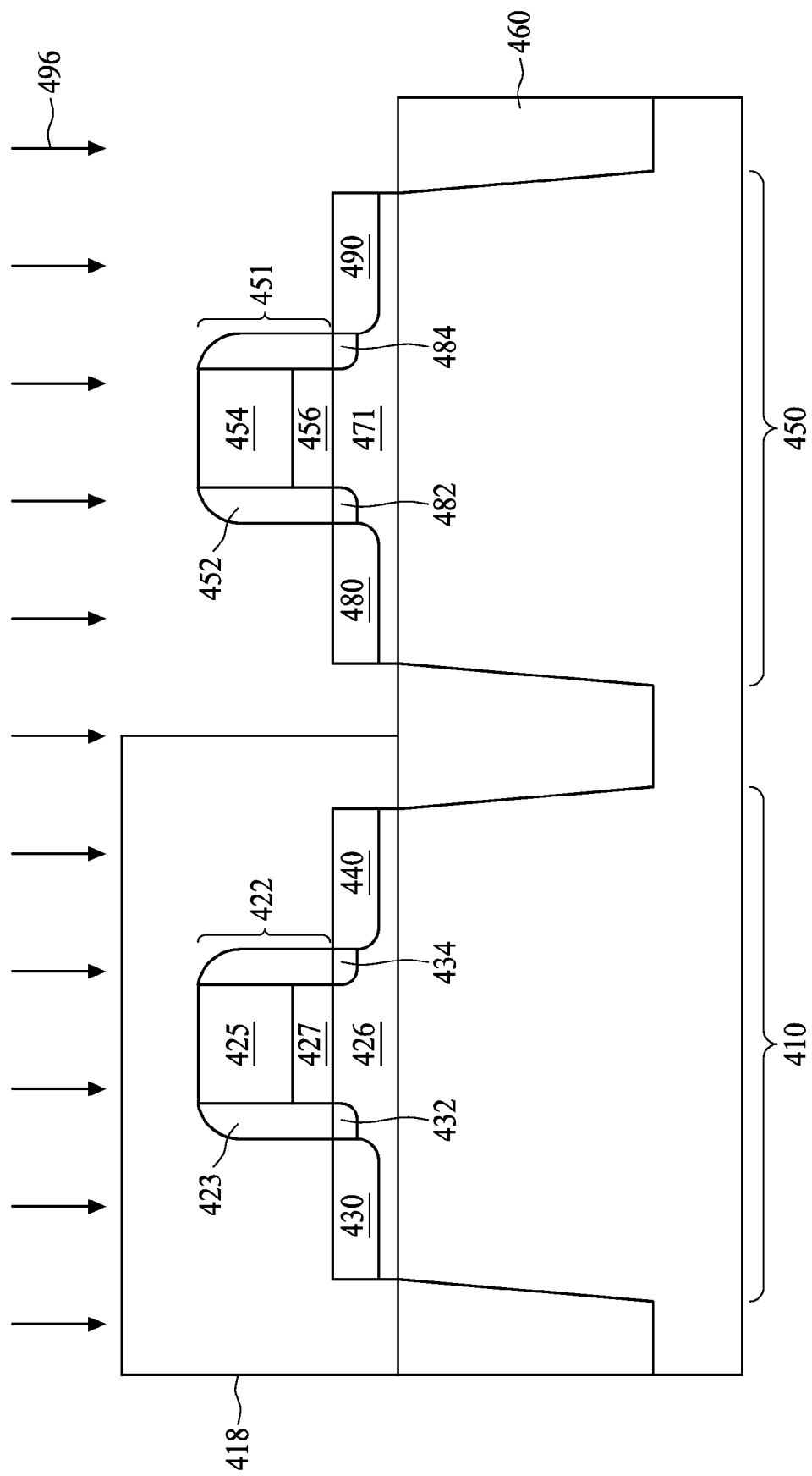

The fifth photoresist layer 417 is removed. The operation of FIG. 4G is similar to the operation of FIG. 3H. A sixth photoresist layer 418 is formed and patterned to cover the first active region 410 as illustrated in FIG. 4G. The second active region 450 is exposed and ready to form source/drain regions. A sixth implantation process 496 is performed to form a second source region 480 and a second drain region 490. The sixth implantation process 496 includes n-type dopants, such as phosphorous. Phosphorous concentration in the second source/drain regions (480, 490) is different from that in the second extension source/drain regions (482, 484). The second source/drain regions (480, 490) are disposed on opposite sides of the second gate stack 451. Accordingly, the second source/drain regions (480, 490) thus offset from an edge of the second gate sidewall spacer 452. A portion of the second extension source/drain regions (482, 484) remains adjacent to the second source/drain regions (480, 490). A thermal process, such as a rapid thermal anneal, is then employed to activate the extension region dopants, which causes the first and second source/drain regions (430, 440, 480, 490) to diffuse laterally and slightly toward the channels.

Figure 4H:
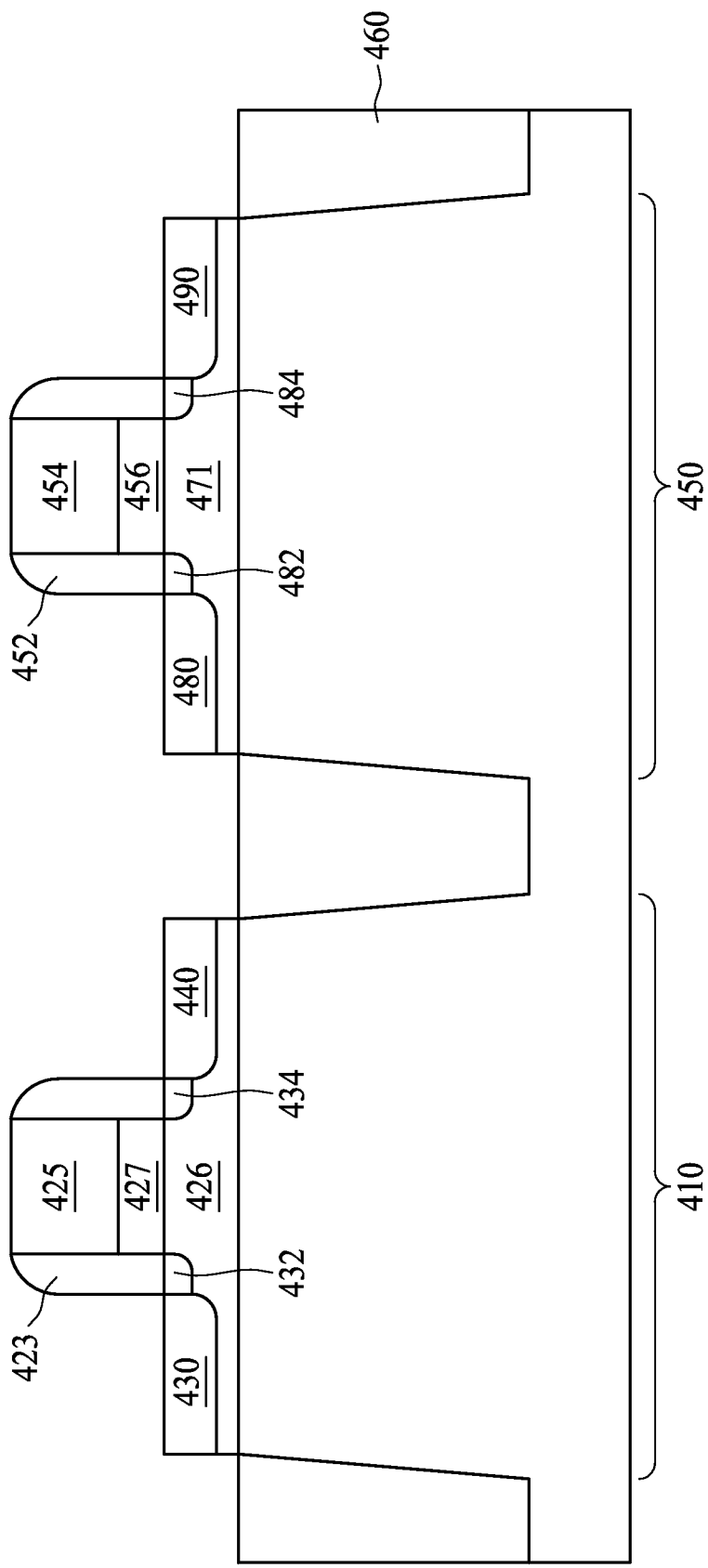

Later, the sixth photoresist layer 418 is removed. The semiconductor device 200 of FIG. 2 is accomplished as shown in FIG. 4H. Diffusion of dopants in source/drain regions (430, 432, 434, 440, 480, 482, 484, 490) are blocked by the carbon doped regions (426, 471) during a thermal process. The carbon doped epitaxial layer has better quality compared to a CVD layer. In addition, the carbon doped epitaxial layer efficiently reduces diffusion of dopants. Thus, electrical properties are well controlled.

In some embodiments, a semiconductor device includes a p-type metal oxide semiconductor device (PMOS) and an n-type metal oxide semiconductor device (NMOS) disposed over a substrate. The PMOS has a first gate structure located on the substrate, a carbon doped n-type well disposed under the first gate structure, a first channel region disposed in the carbon doped n-type well, and activated first source/drain regions disposed on opposite sides of the first channel region. The NMOS has a second gate structure located on the substrate, a carbon doped p-type well disposed under the second gate structure, a second channel region disposed in the carbon doped p-type well, and activated second source/drain regions disposed on opposite sides of the second channel region.

In some embodiments, the carbon concentration in the carbon doped n-type well and the carbon doped p-type well gradually increase from the bottom-most to the top-most of the well regions.

In some embodiments, the carbon concentration in the carbon doped n-type well and the carbon doped p-type well are substantially uniform.

In some embodiments, the semiconductor device further includes activated first extension source/drain regions disposed on opposite sides of the first channel region.

In some embodiments, the semiconductor device further includes activated second extension source/drain regions disposed on opposite sides of the second channel region.

In some embodiments, the first source/drain regions and the second source/drain regions are U-shaped structures.

In some embodiments, the p-type metal oxide semiconductor device (PMOS) and the n-type metal oxide semiconductor device (NMOS) are located on a semiconductor-on-insulator (SOI) substrate.

In some embodiments, a semiconductor device includes a carbon doped epitaxial layer disposed on a substrate, a p-type metal oxide semiconductor device (PMOS), and an n-type metal oxide semiconductor device (NMOS). The p-type metal oxide semiconductor device (PMOS) disposed over the carbon doped epitaxial layer includes a first gate structure located on the carbon doped epitaxial layer, a first channel region disposed in the carbon doped epitaxial layer, and activated first source/drain regions disposed on opposite sides of the first channel region. The n-type metal oxide semiconductor device (NMOS) disposed over the carbon doped epitaxial layer includes a second gate structure located on the carbon doped epitaxial layer, a second channel region disposed in the carbon doped epitaxial layer, and activated second source/drain regions disposed on opposite sides of the second channel region.

In some embodiments, the carbon doped epitaxial layer is disposed adjacent to dielectric isolations without overlapping and contacting each other.

In some embodiments, the carbon concentration in the carbon doped epitaxial layer is substantially uniform.

In some embodiments, the semiconductor device further includes activated first extension source/drain regions disposed on opposite sides of the first channel region.

In some embodiments, the semiconductor device further includes activated second extension source/drain regions disposed on opposite sides of the second channel region.

In some embodiments, the activated first source/drain regions and the activated second source/drain regions are U-shaped structures.

In some embodiments, the p-type metal oxide semiconductor device (PMOS) and the n-type metal oxide semiconductor device (NMOS) are located on a semiconductor-on-insulator (SOI) substrate.

In some embodiments, a method for manufacturing a semiconductor device includes providing a substrate having dielectric isolations configured to define a first active region and a second active region, performing a carbon doping on the first active region and the second active region, forming a first photoresist layer covered on the first active region, performing a first material doping into the second active region, removing the first photoresist layer, forming a second photoresist layer covered on the second active region, performing a second material doping into the first active region, removing the second photoresist layer, annealing the first active region and the second active region, forming a p-type metal oxide semiconductor device (PMOS) on the first active region, and forming a n-type metal oxide semiconductor device (NMOS) on the second active region.

In some embodiments, the method further includes forming a carbon doped epitaxial layer on the first active region and the second active region.

In some embodiments, the method further includes forming a first gate structure on the first active region and a second gate structure on the second active region.

In some embodiments, the method further includes forming activated first extension source/drain regions on opposite sides of the first gate structure, and activated second extension source/drain regions on opposite sides of the second gate structure.

In some embodiments, the method further includes forming spacers on sidewalls of the first gate structure and the second gate structure.

In some embodiments, the method further includes forming activated first source/drain regions on opposite sides of the first gate structure, and activated second source/drain regions on opposite sides of the second gate structure.

The above description includes exemplary operations, but these operations are not necessarily required to be performed in the order shown. Operations may be added, replaced, changed order, skipped, and/or eliminated as appropriate, in accordance with the spirit and scope of the disclosure. Accordingly, the scope of the disclosure should be determined with reference to the following claims, along with the full scope of equivalences to which such claims are entitled.

What is claimed is:

1. A semiconductor device, comprising:
a first carbon doped epitaxial layer disposed on a substrate, wherein the first carbon doped epitaxial layer protrudes from the substrate;
a p-type metal oxide semiconductor device (PMOS) disposed over the first carbon doped epitaxial layer, comprising:
a first gate structure located on the first carbon doped epitaxial layer;
a first channel region entirely disposed in the first carbon doped epitaxial layer; and
activated first source/drain regions disposed on opposite sides of the first channel region, and the first carbon doped epitaxial layer surrounding the first source/drain regions for blocking dopants in the first source/drain regions from penetrating into the first channel region during a thermal process;
a second carbon doped epitaxial layer disposed on the substrate, wherein the second carbon doped epitaxial layer protrudes from the substrate;

an n-type metal oxide semiconductor device (NMOS) disposed over the second carbon doped epitaxial layer, comprising:
a second gate structure located on the second carbon doped epitaxial layer;
a second channel region entirely disposed in the second carbon doped epitaxial layer; and
activated second source/drain regions disposed on opposite sides of the second channel region, and the second carbon doped epitaxial layer surrounding the second source/drain regions for blocking dopants in the second source/drain regions from penetrating into the second channel region during the thermal process; and
an dielectric isolation, arranged to isolate the p-type metal oxide semiconductor device (PMOS) and the n-type metal oxide semiconductor device (NMOS),
wherein the first carbon doped epitaxial layer and the second carbon doped epitaxial layer are entirely doped with carbon, and the first carbon doped epitaxial layer and the second carbon doped epitaxial layer are disposed above and not overlapped in a vertical direction with the dielectric isolation.

2. The semiconductor device of claim 1, wherein the carbon concentration in the first carbon doped epitaxial layer and the second carbon doped epitaxial layer is substantially uniform.

3. The semiconductor device of claim 1, further comprising activated first extension source/drain regions disposed on opposite sides of the first channel region.

4. The semiconductor device of claim 1, further comprising activated second extension source/drain regions disposed on opposite sides of the second channel region.

5. The semiconductor device of claim 1, wherein the activated first source/drain regions and the activated second source/drain regions are U-shaped structures.

6. The semiconductor device of claim 1, wherein the p-type metal oxide semiconductor device (PMOS) and the n-type metal oxide semiconductor device (NMOS) are located on a semiconductor-on-insulator (SOI) substrate.

7. The semiconductor device of claim 1, wherein a bottom of the activated first source/drain regions and a bottom of the activated second source/drain regions are not in contact with the substrate.

8. The semiconductor device of claim 1, wherein the activated first source/drain regions and the activated second source/drain regions are U-shaped structures diffused into the first carbon doped epitaxial layer and the second carbon doped epitaxial layer respectively.

9. The semiconductor device of claim 1, wherein the first gate structure comprises:
a first gate dielectric, disposed on the first channel region;
a first gate electrode, disposed on the first gate dielectric; and
a first sidewall spacer, attached to sidewalls of the first gate dielectric and the first gate electrode; and
the p-type metal oxide semiconductor device further comprises:
a first activated source/drain extension regions, formed in the first carbon doped epitaxial layer and attached to a bottom portion of the first sidewall spacer, for adjusting an electric field in the first channel region.

10. The semiconductor device of claim 9, wherein the second gate structure comprises:
a second gate dielectric, disposed on the second channel region;
a second gate electrode, disposed on the second gate dielectric; and
a second sidewall spacer, attached to sidewalls of the second gate dielectric and the second gate electrode; and
the n-type metal oxide semiconductor device further comprises:
a second activated source/drain extension regions, formed in the second carbon doped epitaxial layer and attached to a bottom portion of the second sidewall spacer, for adjusting an electric field in the second channel region.

11. The semiconductor device of claim 10, wherein the first activated source/drain extension regions and the second activated source/drain extension regions are lightly doped (LDD), medium doped (MDD), or heavily doped (HDD) extension regions.

12. The semiconductor device of claim 10, wherein the first sidewall spacer and the second sidewall spacer are configured to shield the first activated source/drain extension regions and the second activated source/drain extension regions during formations of the activated first source/drain regions and the activated second source/drain regions respectively.

13. A metal oxide semiconductor device, comprising:
a carbon doped structure;
a gate structure located over the carbon doped structure;
a channel region disposed in the carbon doped structure; and
activated source/drain regions disposed in the carbon doped structure on opposite sides of the channel region,
wherein the carbon doped structure is entirely doped with carbon, and the carbon doped structure has carbon concentration that gradually increases from the bottom-most of the carbon doped structure to the top-most of the carbon doped structure in the channel region, and the metal oxide semiconductor device further comprises:
a substrate; and
a dielectric isolation, arranged to be an isolation of the metal oxide semiconductor device;
wherein the carbon doped structure is a carbon doped epitaxial layer disposed above the substrate, the carbon doped structure protrudes from the substrate, and the carbon doped structure is not overlapped with the dielectric isolation in a vertical direction, and the carbon doped structure surrounds the activated source/drain regions for blocking dopants in the activated source/drain regions from penetrating into the channel region during a thermal process.

14. The metal oxide semiconductor device of claim 13, wherein the metal oxide semiconductor device is a p-type metal oxide semiconductor device (PMOS) and the carbon doped structure is doped with n-type dopants.

15. The metal oxide semiconductor device of claim 13, wherein the metal oxide semiconductor device is an n-type metal oxide semiconductor device (NMOS) and the carbon doped structure is doped with p-type dopants.

16. The metal oxide semiconductor device of claim 13, wherein a bottom of the activated source/drain regions is not in contact with the substrate.

17. The metal oxide semiconductor device of claim 13, wherein the activated source/drain regions are U-shaped structures diffused into the carbon doped structure.

18. The metal oxide semiconductor device of claim 13, wherein the first gate structure comprises:
a gate dielectric, disposed on the channel region;
a gate electrode, disposed on the gate dielectric; and a sidewall spacer, attached to sidewalls of the gate dielectric and the gate electrode; and the metal oxide semiconductor device further comprises:

an activated source/drain extension regions, formed in the carbon doped structure and attached to a bottom portion of the sidewall spacer, for adjusting an electric field in the channel region.

19. The metal oxide semiconductor device of claim 18, wherein the activated source/drain extension regions are lightly doped (LDD), medium doped (MDD), or heavily doped (HDD) extension regions.

20. The metal oxide semiconductor device of claim 18, wherein the sidewall spacer is configured to shield the activated source/drain extension regions during formation of the activated source/drain regions.

* * * * *